US011264562B1

(12) United States Patent
Prasad et al.

(10) Patent No.: US 11,264,562 B1
(45) Date of Patent: Mar. 1, 2022

(54) MULTIFERROIC-ASSISTED VOLTAGE CONTROLLED MAGNETIC ANISOTROPY MEMORY DEVICE AND METHODS OF MANUFACTURING THE SAME

(71) Applicant: WESTERN DIGITAL TECHNOLOGIES, INC., San Jose, CA (US)

(72) Inventors: Bhagwati Prasad, San Jose, CA (US); Alan Kalitsov, San Jose, CA (US); Neil Smith, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/004,690

(22) Filed: Aug. 27, 2020

(51) Int. Cl.
*H01L 43/02* (2006.01)
*G11C 11/16* (2006.01)
*H01L 27/22* (2006.01)
*H01L 43/10* (2006.01)

(52) U.S. Cl.
CPC ............ *H01L 43/02* (2013.01); *G11C 11/161* (2013.01); *G11C 11/1673* (2013.01); *G11C 11/1675* (2013.01); *H01L 27/222* (2013.01); *H01L 43/10* (2013.01)

(58) Field of Classification Search
None
See application file for complete search history.

(56) References Cited

U.S. PATENT DOCUMENTS

| 5,198,994 A | 3/1993 | Natori |
| 8,953,366 B2 | 2/2015 | Wolf et al. |
| 9,385,159 B2 | 7/2016 | Taylor |
| 9,721,963 B1 | 8/2017 | Rabkin et al. |
| 9,853,206 B2 | 12/2017 | Pinarbasi et al. |

(Continued)

FOREIGN PATENT DOCUMENTS

| EP | 3128534 | 2/2017 |
| JP | 2006210525 | 8/2006 |
| KR | 10-20160142255 A | 12/2016 |

OTHER PUBLICATIONS

Ahn et al., "Energy-Efficient Phase-Change Memory with Graphene as a Thermal Barrier," Nano Letters, 15, 6809 (2015).

(Continued)

*Primary Examiner* — Tan T. Nguyen
(74) *Attorney, Agent, or Firm* — The Marbury Law Group PLLC

(57) ABSTRACT

A magnetic memory device includes a first electrode, a second electrode, and a layer stack located between the first electrode and the second electrode. The layer stack includes a reference layer, a tunnel barrier layer, a free layer, and a magnetoelectric multiferroic layer including at least one crystalline grain. The magnetization of the magnetoelectric multiferroic layer may be axial, canted, or in-plane. For axial or canted magnetization of the magnetoelectric multiferroic layer, a deterministic switching of the free layer may be achieved through coupling with the axial component of magnetization of the magnetoelectric multiferroic layer. Alternatively, the in-plane magnetization of the magnetoelectric multiferroic layer may be employed to induce precession of the magnetization angle of the free layer.

19 Claims, 14 Drawing Sheets

(56) References Cited

U.S. PATENT DOCUMENTS

| | | | |
|---|---|---|---|
| 9,871,193 | B2 | 1/2018 | Kioussis et al. |
| 9,941,299 | B1 | 4/2018 | Chen et al. |
| 10,229,723 | B1 | 3/2019 | Choi et al. |
| 10,354,710 | B2 | 7/2019 | Petti et al. |
| 10,381,551 | B1 | 8/2019 | Lille |
| 10,403,753 | B2 | 9/2019 | Jonker et al. |
| 2001/0048622 | A1 | 12/2001 | Kwon et al. |
| 2003/0053350 | A1 | 3/2003 | Krieger et al. |
| 2003/0155602 | A1 | 8/2003 | Krieger et al. |
| 2003/0178667 | A1 | 9/2003 | Krieger et al. |
| 2003/0179633 | A1 | 9/2003 | Krieger et al. |
| 2004/0026729 | A9 | 2/2004 | Krieger et al. |
| 2004/0159835 | A1 | 8/2004 | Krieger et al. |
| 2005/0151177 | A1 | 7/2005 | Miyazawa et al. |
| 2007/0020803 | A1 | 1/2007 | Saigoh et al. |
| 2009/0026513 | A1 | 1/2009 | Johansson et al. |
| 2009/0237987 | A1* | 9/2009 | Zhu .................... H01L 43/08 365/171 |
| 2010/0102369 | A1 | 4/2010 | Tian et al. |
| 2010/0144064 | A1 | 6/2010 | Saigoh et al. |
| 2010/0271870 | A1* | 10/2010 | Zheng ................ G11C 11/161 365/171 |
| 2012/0104325 | A1 | 5/2012 | Talapin et al. |
| 2013/0058157 | A1 | 3/2013 | Wolf et al. |
| 2014/0098458 | A1 | 4/2014 | Almadhoun et al. |
| 2014/0177327 | A1* | 6/2014 | Khalili Amiri ...... H01L 43/02 365/158 |
| 2015/0228321 | A1 | 8/2015 | Lee et al. |
| 2015/0372225 | A1 | 12/2015 | Gaidis et al. |
| 2015/0380631 | A1 | 12/2015 | Taylor |
| 2016/0043307 | A1 | 2/2016 | Kioussis et al. |
| 2016/0099035 | A1 | 4/2016 | Khalili Amiri et al. |
| 2016/0172365 | A1 | 6/2016 | McKinnon et al. |
| 2016/0276579 | A1 | 9/2016 | Gaidis et al. |
| 2016/0308107 | A1 | 10/2016 | Talapin et al. |
| 2017/0114241 | A1 | 4/2017 | Almadhoun et al. |
| 2017/0316713 | A1 | 11/2017 | Hyman |
| 2018/0158934 | A1 | 6/2018 | Jonker et al. |
| 2018/0158955 | A1 | 6/2018 | Jonker et al. |
| 2018/0248113 | A1* | 8/2018 | Pinarbasi ............ H01L 43/12 |
| 2018/0308536 | A1 | 10/2018 | Buhrman et al. |
| 2019/0027201 | A1 | 1/2019 | Petti et al. |
| 2019/0080738 | A1 | 3/2019 | Choi et al. |
| 2019/0333559 | A1 | 10/2019 | Van'T Erve et al. |
| 2020/0006633 | A1 | 1/2020 | Lille |
| 2020/0185015 | A1* | 6/2020 | Le ....................... H01L 43/08 |
| 2020/0241840 | A1 | 7/2020 | Ikegami et al. |

OTHER PUBLICATIONS

Bea, H. et al., "Ferroelectricity Down to at Least 2nm in Multiferroic BiFeO3 Epitaxial Thin Films," Japanese Journal of Applied Physics, vol. 45, No. 7, 2006, pp. L187-L189.
Boyn, S. et al., "Tunnel Electroresistance in BiFeO3 Junctions: Size Does Matter," Cite as: Appl. Phys. Lett. 109, 232902 (2016); https://doi.org/10.1063/1.4371311 Submitted: Sep. 9, 2016 . Accepted: Nov. 17, 2016 . Published Online: Dec. 7, 2016.
Cadore et al., "Thermo Activated Hysteresis on High Quality Graphene/h-BN Devices," Nano Lett. 14, 5437 (2014).
Cherifi, R.O. et al., "Electric-field control of magnetic order above room temperature" Nature Materials, Nature Publishing Group, 2014, pp.nmat3870. 10.1038/NMAT3870. hal-01053074, https://hal.archives-ouvertes.fr/hal-01053074.
Chiba, D. et al., "Electrical control of the ferromagnetic phase transition in cobalt at room temperature," Nature Materials, vol. 10, pp. 853-856, Nov. 2011, www.nature.com/naturematerials.
Chiba, D. et al., "Electrical Manipulation of Magnetization Reversal in a Ferromagnetic Semiconductor," SCIENCE, vol. 301 pp. 943-945, Aug. 15, 2003, www.sciencemag.org.
Chiu, Y.C. et al., "Multilevel nonvolatile transistor memories using a star-shaped poly((4-diphenylamino)benzyl methacrylate) gate electret," NPG Asia Materials (2013), vol. 5, e35; doi:10.1038/am.2012.64, available at https://www.nature.com/articles/am201264.
Fong, D.D. et al., "Ferroelectricity in Ultrathin Perovskite Films," Science, vol. 304, Issue 5677, pp. 1650-1653, (2004), DOI: 10.1126/science.1098252.
Heron, J. T. et al., "Electric field control of magnetism using BiFeO3-based heterostructures," Applied Physics Reviews, vol. 1, 021303 (2014); doi: 10.1063/1.4870957, View online: http://dx.doi.org/10.1063/1.4870957.
Huang et al., "Graphene/Si CMOS Hybrid Hall Integrated Circuits," Science Reports, 4, 5548 (2014).
Ismach et al., "Direct Chemical Vapor Deposition of Graphene on Dielectric Surfaces," Nano Letters, 10, 1542 (2010).
ISR—Notification of Transmittal of the International Search Report and Written Opinion of the International Search Authority for International Patent Application No. PCT/US2019/046717, dated Nov. 17, 2019, 11 pages.
Jerry, M. et al., "Ferroelectric FET Analog Synapse for Acceleration of Deep Neural Network Training," *Tech. Dig.—Int. Electron Devices Meeting (IEDM)*, IEEE, San Francisco, CA 2017, p. 6.2.1-6.2.4, IEDM17-139 (Published—Jan. 23, 2018).
Lequex, S. et al., "A magnetic synapse: multilevel spin-torque memristor with perpendicular anisotropy" *Scientific Reports*, vol. 6, No. 31510 (2 016), https://doi.org/10.1038/srep31510.
Maksymovych, P. et al., "Ultrathin Limit and Dead-Layer Effects in Local Polarization Switching of BiFeo3," Physical Review B 85, 014119 (2012), DOI: 10.1103/PhysRevB.85.014119 PACS Nos. 77.80.Fm, 68.37.-d, 77.65.-j, 77.80.Dj.
Manipatruni, S. et al., "Beyond CMOS computing with spin and polarization," *Nature Physics*, vol. 14, pp. 338-343, (2018), https://doi.org/10.1038/s41567-018-0101-4.
Miro et al., "An Atlas of Two-Dimensional Materials," Chern. Soc. Rev., 2014,43, 6537-6554.
Ohtake, M. et al., "L10 ordered phase formation in FePt, FePd, CoPt, and CoPd alloy thin films epitaxially grown on MgO(001) single-crystal substrates," Journal of Applied Physics, vol. 111, 07A708 (2012); http://dx.doi.org/10.1063/1.3672856.
Saremi, S. et al., "Electronic Transport and Ferroelectric Switching in Ion-Bombarded, Defect-Engineered BiFeO3 Thin Films," *Adv. Mater. Interfaces* 2018, vol. 5, 1700991, (2018).
Saremi, S. et al., "Local Control of Defects and Switching Properties in Ferroelectric Thin Films," Phys. Rev. Mater., vol. 2, 084414 (2018).
Sengupta, A. et al., "Encoding neural and synaptic functionalities in electron spin: A pathway to efficient neuromorphic computing," Applied Physics Reviews 4, 041105 (2017); https://doi.org/10.1063/1.5012763.
Song et al., "Robust bi-stable Memory Operation in Single-layer Graphene Ferroelectric Memory," Appl. Phys. Lett. 99, 042109 (2011).
Spaldin, N. A. et al., "Advances in magnetoelectric multiferroics," *Nature Materials*, vol. 18, pp. 203-212, (2019), https://doi.org/10.1038/s41563-018-0275-2.
Wang, L. et al., "Charge-induced ferromagnetic phase transition and anomalous Hall effect in full d-band nonmagnetic metals," Physical Review B 99, 224416 (2019).
Xie, L. et al., "Giant Ferroelectric Polarization in Ultrathin Ferroelectrics via Boundary-Condition Engineering," Advanced Materials, 1701475, pp. 1-7, (2017), DOI: 10.1002/adma.201701475.
Yamada, Y. et al., "Electrically Induced Ferromagnetism at Room Temperature in Cobalt-Doped Titanium Dioxide," SCIENCE, vol. 332, pp. 1065-1067, May 27, 2011, www.sciencemag.org.
Yoon, M. et al., "Relaxornormal ferroelectric transition in tetragonalrich field of Pb(Ni1/3Nb2/3)O3PbTiO3PbZrO3 system," Journal of Applied Physics, vol. 77, No. 8, pp. 3991-4001, (1995); http://dx.doi.org/10.1063/1.359510.
Zheng et al., "Gate-controlled Non-Volatile Graphene-ferroelectric Memory," Appl. Phys. Lett. 94, 163505 (2009).
Zheng et al., "Graphene Field Effect Transistors with Ferroelectric Gating," Phys. Rev. Lett. 105, 166602 (2010).
U.S. Appl. No. 16/212,132, filed Dec. 6, 2018, SanDisk Technologies LLC.

(56) References Cited

OTHER PUBLICATIONS

U.S. Appl. No. 16/212,257, filed Dec. 6, 2018, SanDisk Technologies LLC.
U.S. Appl. No. 16/212,342, filed Dec. 6, 2018, SanDisk Technologies LLC.
U.S. Appl. No. 16/212,420, filed Dec. 6, 2018, SanDisk Technologies LLC.
U.S. Appl. No. 16/227,889, filed Dec. 20, 2018, SanDisk Technologies LLC.
U.S. Appl. No. 16/250,403, filed Jan. 17, 2019, SanDisk Technologies LLC.
U.S. Appl. No. 16/401,172, filed May 2, 2019, SanDisk Technologies LLC.
U.S. Appl. No. 16/419,243, filed May 22, 2019, SanDisk Technologies LLC.
U.S. Appl. No. 16/422,187, filed May 24, 2019, SanDisk Technologies LLC.
U.S. Appl. No. 16/442,858, filed Jun. 17, 2019, SanDisk Technologies LLC.
U.S. Appl. No. 16/558,552, filed Sep. 3, 2019, SanDisk Technologies LLC.
U.S. Appl. No. 16/666,967, filed Oct. 29, 2019, SanDisk Technologies LLC.
U.S. Appl. No. 16/686,860, filed Nov. 18, 2019, Western Digital Technologies, Inc.
U.S. Appl. No. 16/686,917, filed Nov. 18, 2019, Western Digital Technologies, Inc.
U.S. Appl. No. 16/692,903, filed Nov. 22, 2019, Western Digital Technologies, Inc.
U.S. Appl. No. 16/692,965, filed Nov. 22, 2019, Western Digital Technologies, Inc.
U.S. Appl. No. 16/693,006, filed Nov. 22, 2019, Western Digital Technologies, Inc.
U.S. Appl. No. 16/778,245, filed Jan. 31, 2020, SanDisk Technologies LLC.
U.S. Appl. No. 16/781,225, filed Feb. 4, 2020, Western Digital Technologies, Inc.
U.S. Appl. No. 16/853,440, filed Apr. 20, 2020, Western Digital Technologies, Inc.
U.S. Appl. No. 16/944,758, filed Jul. 31, 2020, Western Digital Technologies, Inc.
U.S. Appl. No. 16/944,826, filed Jul. 31, 2020, Western Digital Technologies, Inc.
USPTO Office Communication, Notice of Allowance and Fee(s), for U.S. Appl. No. 17/004,534, dated Sep. 20, 2020, 19 pages.
Notification of Transmittal of the International Search Report and the Written Opinion of the International Searching Authority for International Patent Application No. PCT/US2021/035929, dated Oct. 25, 2021, 10 pages.

\* cited by examiner

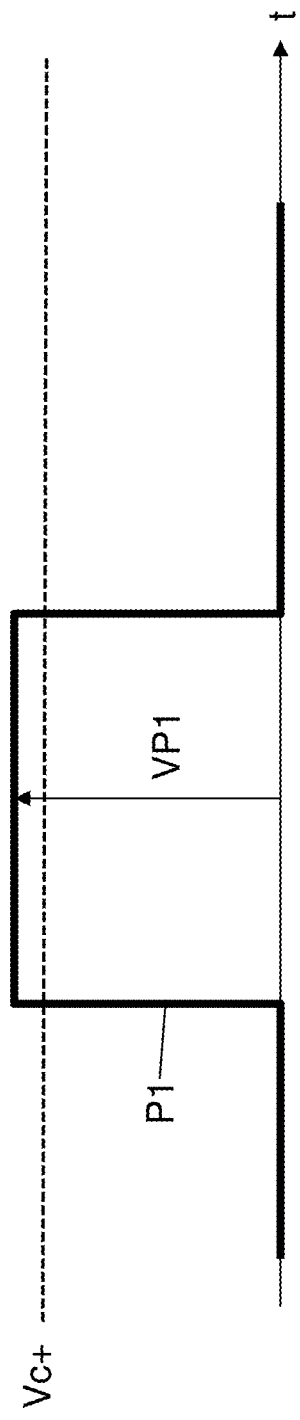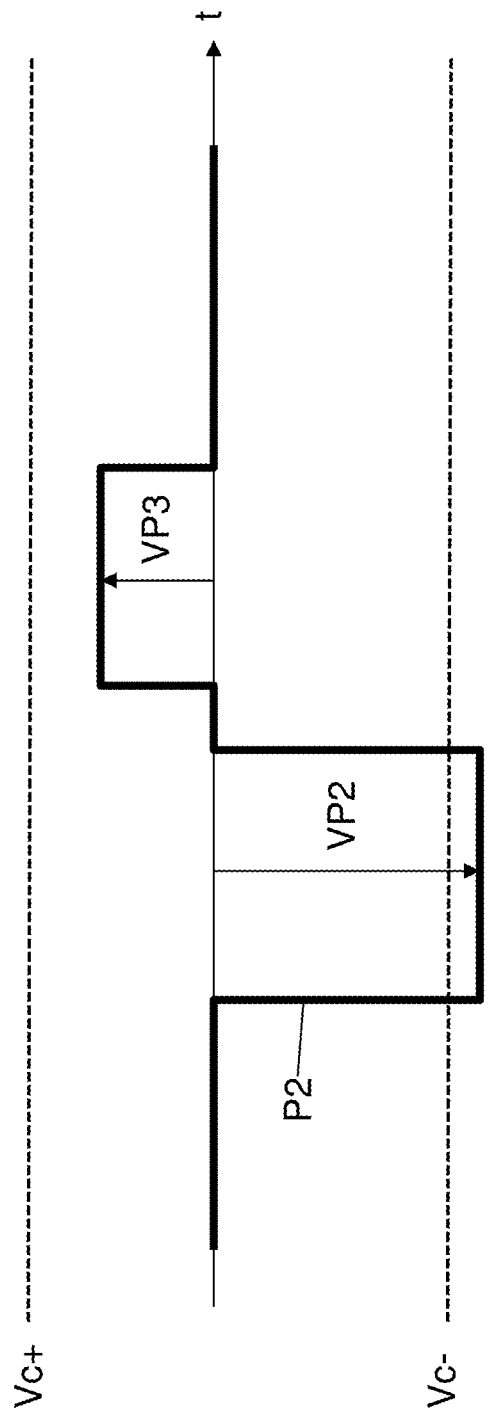

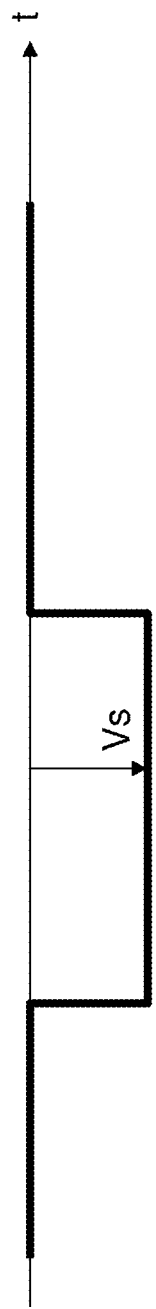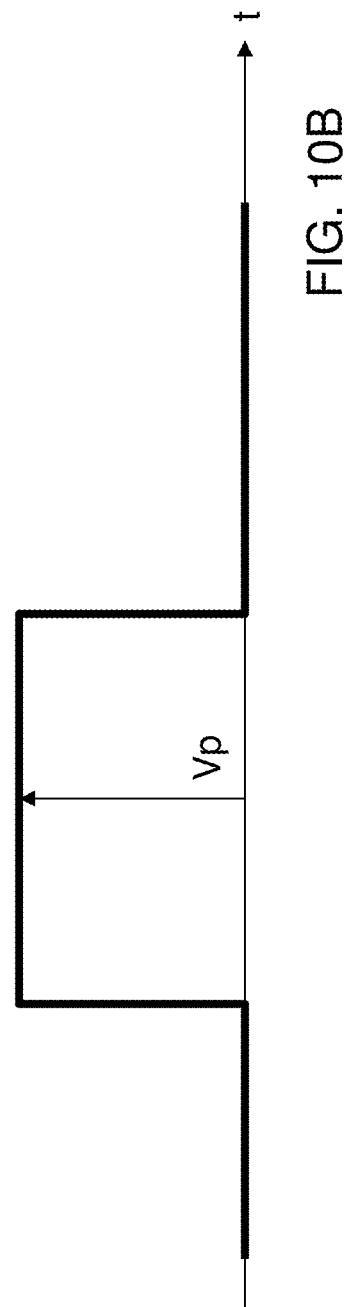

MULTIFERROIC-ASSISTED VOLTAGE CONTROLLED MAGNETIC ANISOTROPY MEMORY DEVICE AND METHODS OF MANUFACTURING THE SAME

FIELD

The present disclosure relates generally to the field of magnetic (e.g., spintronic) memory devices, and specifically to a magnetoresistive random access memory ("MRAM") device including a multiferroic layer and methods of manufacturing the same.

BACKGROUND

A magnetoresistive memory device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the magnetoresistive memory device requires flipping of the direction of the magnetization of the free layer employing various external power sources, which may be magnetic in nature or may employ a spin transfer mechanism.

Voltage controlled magnetic anisotropy (VCMA) refers to an effect in which the perpendicular magnetic anisotropy of the free layer has a first-order dependence on the externally applied voltage across the free layer located in a magnetic tunnel junction which includes a dielectric tunnel barrier layer between the free layer and a ferromagnetic reference layer. The thickness of the dielectric tunnel barrier layer may be at least 1 nm, which reduces tunneling current flow through the dielectric tunnel barrier layer below a critical current required to switch the magnetization direction of the free layer during programming. Therefore, an applied voltage is used to switch the magnetization direction of the free layer. The applied voltage lowers the energy perpendicular magnetic anisotropy in one bias direction and raises it for the other bias direction. However, the VCMA programming is non deterministic and requires precise control of the timing of the applied voltage pulses to obtain a desired magnetization direction of the free layer.

SUMMARY

According to an aspect of the present disclosure, a magnetic memory device is provided, which comprises: a first electrode; a second electrode; and a layer stack located between the first electrode and the second electrode and comprising, from one side to another, a reference layer, a tunnel barrier layer, a free layer, and a magnetoelectric multiferroic layer including at least one crystalline grain having an easy axis of magnetization along an axial direction or along a first tilted direction having a first tilt angle less than 90 degrees relative to the axial direction, the axial direction being perpendicular to an interface between the free layer and the tunnel barrier layer.

According to another aspect of the present disclosure a method of programming the magnetic memory device includes applying a first programming voltage pattern comprising a first positive voltage having a magnitude greater than a coercive voltage sufficient to switch a magnetization direction of the magnetoelectric multiferroic layer, and applying a second programming voltage pattern comprising a negative voltage having a magnitude greater than the coercive voltage followed by a second positive voltage having a magnitude less than the coercive voltage.

In one embodiment, the first positive voltage deterministically programs the magnetization direction of the magnetoelectric multiferroic layer to be parallel to a magnetization direction of the reference layer, and the first positive voltage has a sufficient magnitude to lower a perpendicular magnetic anisotropy of the free layer that allows the free layer to switch its magnetization direction to be parallel to the magnetization direction of the reference layer. The negative voltage deterministically programs the magnetization direction of the magnetoelectric multiferroic layer to be antiparallel to the magnetization direction of the reference layer, and the negative voltage increases the perpendicular magnetic anisotropy of the free layer such that the free layer cannot switch its magnetization direction. The second positive voltage does not have a sufficient magnitude to switch the magnetization direction of the magnetoelectric multiferroic layer, and the second positive voltage has a sufficient magnitude to lower the perpendicular magnetic anisotropy of free layer that allows the free layer to deterministically switch its magnetization direction to be antiparallel to magnetization direction of the reference layer.

According to yet another aspect of the present disclosure, a magnetic memory device comprises a first electrode, a second electrode, and a layer stack located between the first electrode and the second electrode and comprising, from one side to another, a reference layer, a tunnel barrier layer, a free layer, and a voltage controlled magnetic anisotropy (VCMA) assist structure having an in-plane magnetization direction.

BRIEF DESCRIPTION OF THE DRAWINGS

FIG. 6A is a diagram illustrating a first voltage pulse pattern for programming the magnetic memory cell of the first exemplary structure into a first magnetic state according to an aspect of the present disclosure.

FIG. 6B is a diagram illustrating a second voltage pulse pattern for programming the magnetic memory cell of the first exemplary structure into a second magnetic state according to an aspect of the present disclosure.

FIG. 10A is a diagram of a sensing voltage pattern for sensing a magnetic state of the magnetic memory device of the second exemplary structure according to the second embodiment of the present disclosure.

FIG. 10B is a diagram of a programming voltage pattern for programming a magnetic state of the magnetic memory device of the second exemplary structure according to the second embodiment of the present disclosure.

DETAILED DESCRIPTION

Figure 1:
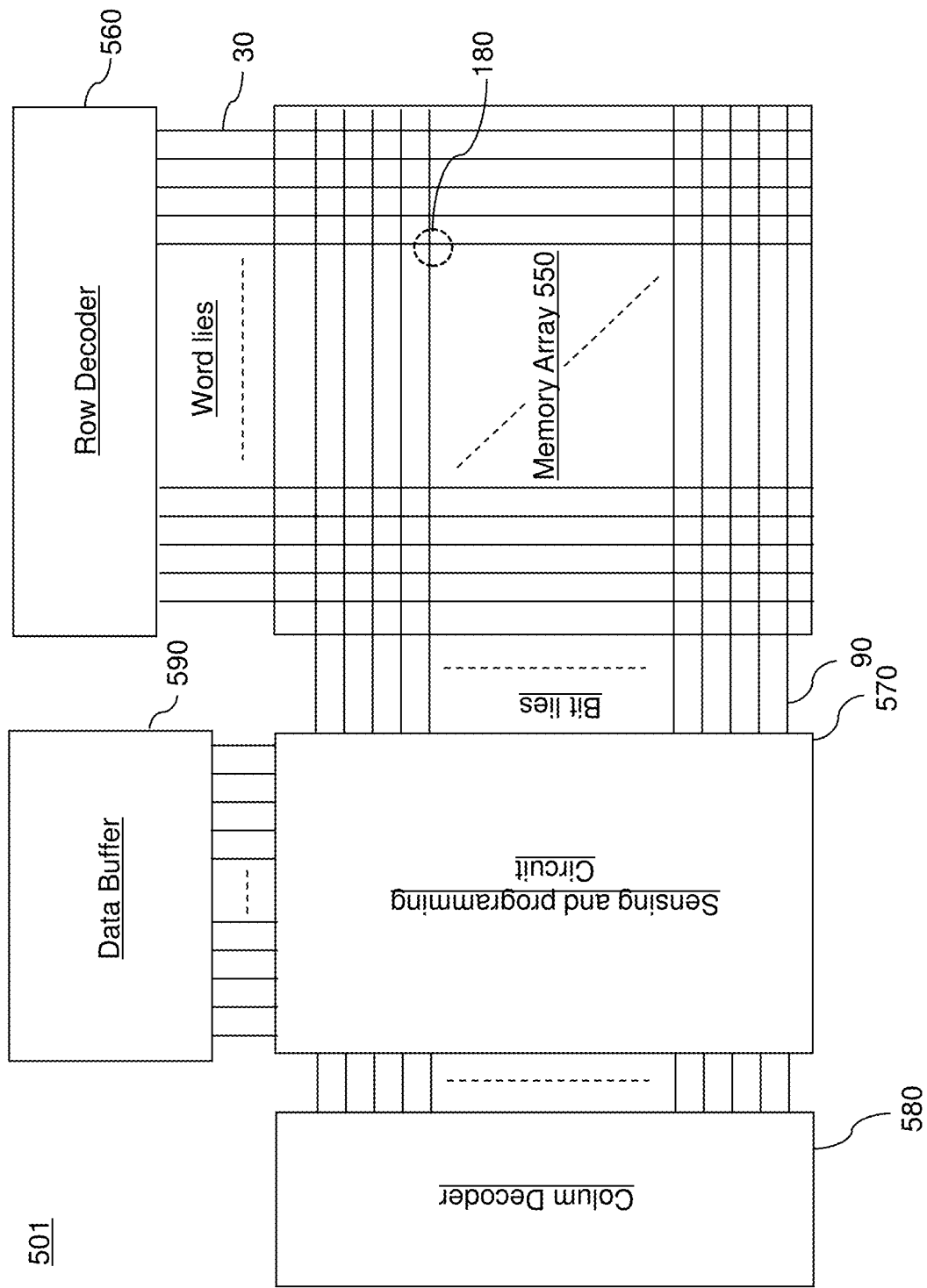
FIG. 1 is a schematic diagram of a random access array of magnetic tunnel junction devices according to an embodiment of the present disclosure.

Embodiments of the present disclosure are directed to a voltage controlled magnetic anisotropy memory device containing a magnetoelectric multiferroic layer and methods of operating the same, the various aspects of which are described in detail herebelow. The magnetoelectric multiferroic layer provides a deterministic VCMA programming mechanism (e.g., where the magnetization direction of the free layer is not dependent on the duration of the programming voltage pulse), and/or provides a precisely controlled, in-plane assist magnetic field that is determined by the crystalline characteristics of the magnetoelectric multiferroic layer.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most. As used herein, a "ferroelectric material" refers to any material that exhibits spontaneous ferroelectric polarization that can be reversed by the application of an external electric field (e.g., exhibits ferroelectricity). As used herein, a "multiferroic" material refers to a material that exhibits at least two ferroic orders, such as magnetic (ferromagnetism, antiferromagnetism, or ferrimagnetism) and ferroelectric. As used herein, a "magnetoelectric multiferroic" refers to a material that exhibits a ferromagnetic-type order and ferroelectricity. A change in total magnetization is coupled to a change in total ferroelectric polarization in a magnetoelectric multiferroic material, and thus, a change in a magnetic moment direction of the material can be coupled to a change in the ferroelectric polarization direction and vice versa.

FIG. 1 is a schematic diagram of a random access memory device 501 of magnetic tunnel junction devices 180 according to an embodiment of the present disclosure. As used herein, a "random access memory device" refers to a memory device including memory cells that allow random access, i.e., access to any selected memory cell upon a command for reading the contents of the selected memory cell.

The random access memory device 501 of the embodiments of the present disclosure may comprise an MRAM device, such as a multistate STT-type MRAM device containing multiferroic portions. The device 501 includes a memory array region 550 containing an array of the respective magnetic devices, such as magnetic tunnel junction devices (e.g., magnetoresistive memory cells) 180 located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the first electrically conductive lines 30 may be electrically connected to, and/or may comprise, bottom electrodes of a respective row of magnetic tunnel junction devices 180 in the memory array region 550, while the second electrically conductive lines 90 may be electrically connected to, and/or may comprise, top electrodes of a respective column of magnetic tunnel junction devices 180 in the memory array region 550.

The random access memory device 501 may also contain a row decoder 560 connected to the word lines, a sensing and programming circuit 570 (which may include sense amplifiers, programming transistors, and control circuits) connected to the bit lines, a column decoder 580 connected to the bit lines, and a data buffer 590 connected to the sense circuitry. The magnetic tunnel junction devices 180 are provided in an array configuration that forms the random access memory device 501. In one embodiment, the magnetic tunnel junction devices 180 may be provided as a rectangular array. As such, each of the magnetic tunnel junction devices 180 can be a two-terminal device including a respective first electrode and a respective second electrode. It should be noted that the location and interconnection of elements are schematic, and the elements may be arranged in a different configuration. Further, a magnetic tunnel junction device 180 may be manufactured as a discrete device, i.e., a single isolated device.

The random access configuration illustrated in the random access memory device 501 is only exemplary, and the magnetic tunnel junction devices 180 of the embodiments of the present disclosure can be connected in different interconnection configurations.

Figure 2A:
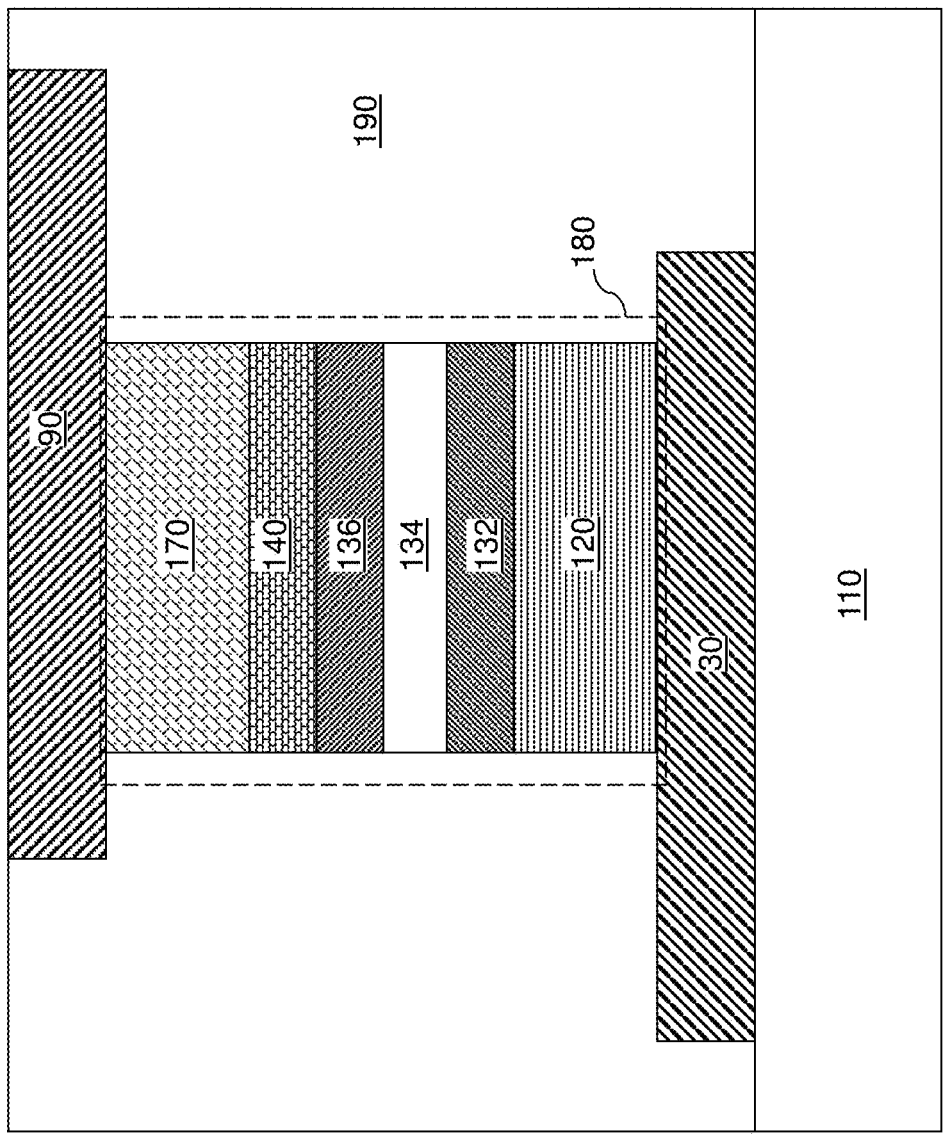
FIG. 2A is a vertical cross-sectional view of a first exemplary structure after formation according to a first embodiment of the present disclosure.
Figure 2B:
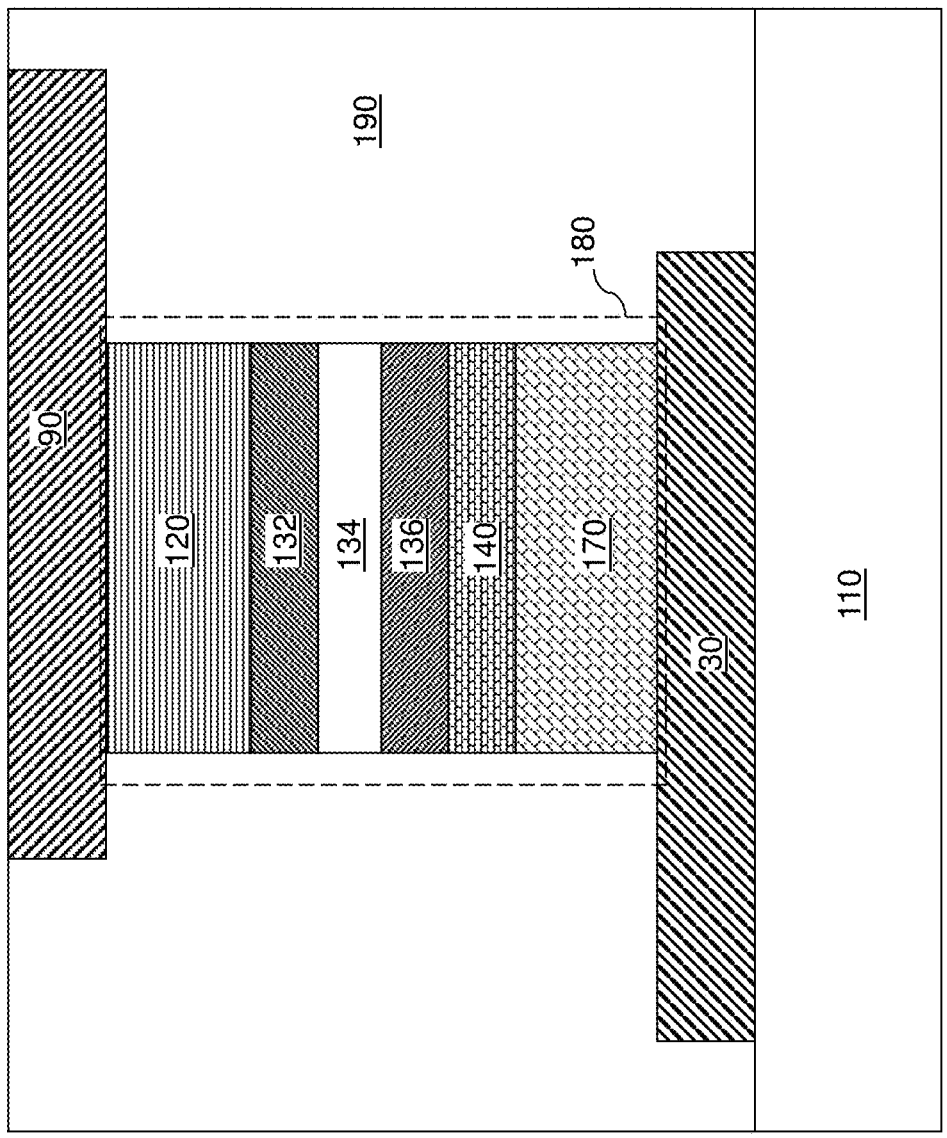
FIG. 2B is a vertical cross-sectional view of an alternative embodiment of the first exemplary structure according to the first embodiment of the present disclosure.

Referring to FIGS. 2A and 2B, exemplary configurations of a magnetic tunnel junction device 180 are illustrated in first exemplary structures. The configuration of FIG. 2A and the configuration of FIG. 2B are alternative configurations that may be derived from each other by reversing the order of material deposition during formation of a magnetic tunnel junction device 180, which is a magnetic memory device.

The first exemplary structure includes an optional insulating material layer 110 that includes an insulating material such as undoped silicate glass, a doped silicate glass, organosilicate glass, silicon nitride, a dielectric metal oxide, or a combination thereof. In one embodiment, the insulating material layer 110 comprises an insulating substrate, such as a ceramic or a glass substrate. In another embodiment, the insulating material layer 110 can be provided over a semiconductor substrate (not shown) with semiconductor devices (not shown) such as field effect transistors thereupon. In this case, the insulating material layer 110 may include a plurality of interconnect-level dielectric material layers embedding metal interconnect structures therein. The metal interconnect structure can provide electrical connection between the semiconductor devices and to the first electrically conductive lines 30 and the second electrically conductive lines 90 that are formed above the insulating material layer 110. In this case, structural elements that are formed above the insulating material layer 110 may be embedded within a dielectric matrix (not expressly shown) that embeds the first electrically conductive lines 30 and the second electrically conductive lines.

First electrically conductive lines 30 can be formed over the insulating material layer 110. The first electrically conductive lines 30 may be formed over the top surface of the insulating material layer 110 by depositing and patterning at least one metallic layer and patterning the at least one metallic layer into line-shaped structures that laterally extend along a first horizontal direction. In one embodiment, the at least one metallic layer may include a stack of a metallic barrier layer including a conductive metallic nitride and a high-electrical-conductivity metal layer such a copper layer or a tungsten layer. Alternatively, line cavities may be formed in an upper portion of the insulating material layer 110, and the first electrically conductive lines 30 may be formed by a damascene method in which at least one metallic material is deposited in the line cavities, and excess portions of the at least one metallic material is removed from above the horizontal plane including the top surface of the insulating material layer 110. Each portion of a first electrically conductive line 30 that contacts an overlying magnetic tunnel junction device 180 comprises a first electrode of the magnetic tunnel junction device 180, which is a magnetic memory device.

A continuous layer stack can be deposited over the first electrically conductive lines 30. The continuous layer stack includes, from bottom to top or from top to bottom, an optional continuous synthetic antiferromagnetic (SAF) structure, a continuous ferromagnetic reference layer, a continuous tunnel barrier layer, a continuous ferromagnetic free layer, a continuous magnetoelectric multiferroic layer, and an optional continuous nonmagnetic capping layer.

The optional SAF structure may include a superlattice structure including an alternating sequence of ferromagnetic material layers and conductive nonmagnetic material layers. In an illustrative example, the superlattice structure may include $[X/Q]_n$, in which X represents a ferromagnetic material layer, such as Co, CoFe, Fe, or CoFeB layer, Q represents a nonmagnetic material layer, such as Pt or Pd layer, and n represents the total number of repetitions of a bilayer stack of the ferromagnetic material layer and the nonmagnetic material layer. The total number n of repetitions may be in a range from 2 to 20, such as from 3 to 8, although a greater number may also be employed.

The continuous reference layer includes a ferromagnetic material having perpendicular magnetic anisotropy. The continuous reference layer includes a ferromagnetic material such as CoFe or CoFeB. The continuous reference layer may be deposited, for example, by physical vapor deposition, and may have a thickness in a range from 1 nm to 3 nm, although lesser and greater thicknesses may also be employed.

The continuous tunnel barrier layer includes a tunneling dielectric material such as MgO. The continuous tunnel barrier layer may be deposited, for example, by physical vapor deposition. The thickness of the continuous tunnel barrier layer may be in a range from 1 nm to 2 nm, such as 1.5 nm to 2 nm, although lesser and greater thicknesses may also be employed.

The continuous free layer includes a ferromagnetic material having perpendicular magnetic anisotropy. The continuous free layer includes a ferromagnetic material such as CoFe or CoFeB. The continuous free layer may be deposited, for example, by physical vapor deposition, and may have a thickness in a range from 0.6 nm to 2 nm, although lesser and greater thicknesses may also be employed.

The continuous magnetoelectric multiferroic layer comprises a magnetoelectric multiferroic material. As used herein, a "multiferroic" refers to a material that exhibits at least two ferroic orders (such as ferromagnetism and ferroelectricity) As used herein, a "magnetoelectric multiferroic" refers to a material that exhibits a ferromagnetic-type order and ferroelectricity. A change in total magnetization is coupled to a change in total electric polarization in a magnetoelectric multiferroic, and thus, a magnetic transition can be coupled to a change in the ferroelectric polarization and vice versa.

The continuous magnetoelectric multiferroic layer may comprise any polycrystalline multiferroic material or a single crystalline multiferroic material that can generate a non-zero net magnetization either as deposited, or upon application of an initializing magnetic field or an initializing electric field. In an illustrative example, the continuous magnetoelectric multiferroic layer may comprise a material selected from $BiFeO_3$, $h\text{-}YMnO_3$, $BaNiF_4$, $PbVO_3$, BiMnO$_3$, LuFe$_2$O$_4$, HoMn$_2$O$_5$, h-HoMnO$_3$, h-ScMnO$_3$, h-ErMnO$_3$, h-TmMnO$_3$, h-YbMnO$_3$, h-LuMnO$_3$, K$_2$SeO$_4$, Cs$_2$CdI$_4$, TbMnO$_3$, Ni$_3$V$_2$O$_8$, MnWO$_4$, CuO, ZnCr$_2$Se$_4$, LiCu$_2$O$_2$, and Ni$_3$B$_7$O$_{13}$I. The continuous magnetoelectric multiferroic layer may be deposited by a suitable deposition method, such as physical vapor deposition. The thickness of the continuous magnetoelectric multiferroic layer can be 1 nm or less, such as in a range from 0.3 nm to 1 nm, such as from 0.5 nm to 0.8 nm, although lesser and greater thicknesses can also be employed.

In one embodiment, the polarization and magnetization directions of the continuous magnetoelectric multiferroic layer are orthogonal to each other. The continuous magnetoelectric multiferroic layer includes at least one crystalline grain having an easy axis of magnetization along an axial direction or along a first tilted (i.e., canted) direction having a first tilt angle less than 90 degrees relative to the axial direction. The axial direction is perpendicular to the interface between the continuous free layer and the continuous tunnel barrier layer. In one embodiment, the continuous magnetoelectric multiferroic layer includes a plurality of crystalline grains having an easy axis of magnetization along the axial direction or along a respective first tilted direction having a respective first tilt angle less than 90 degrees relative to the axial direction.

Generally, the magnetization direction in the crystalline grains of the continuous magnetoelectric multiferroic layer may depend on the preferred grain orientation and/or impurity doping within the magnetoelectric multiferroic layer. If the magnetoelectric multiferroic material comprises BiFeO$_3$, then a polycrystalline BiFeO$_3$ layer having a preferred grain orientation along the (110) plane can provide a predominantly axial magnetization direction, i.e., more than 50% all crystalline grains can have a respective magnetization direction (e.g., spin orientation) that is perpendicular to the interface between the continuous tunnel barrier layer and the continuous free layer. A polycrystalline BiFeO$_3$ layer having a preferred grain orientation along the (100) plane can provide a predominantly canted magnetization direction along the <111> direction, i.e., more than 50% all crystalline grains can have a respective magnetization direction (e.g., spin orientation) that is not perpendicular to, and not parallel to, the interface between the continuous tunnel barrier layer and the continuous free layer. In contrast, a polycrystalline BiFeO$_3$ layer having the preferred grain orientation along the (100) plane but which is doped with La on the Bi lattice sites can provide a predominantly axial magnetization direction, i.e., more than 50% all crystalline grains can have a respective magnetization direction (e.g., spin orientation) that is perpendicular to the interface between the continuous tunnel barrier layer and the continuous free layer. A polycrystalline BiFeO$_3$ layer having a preferred grain orientation along the (111) plane can provide predominantly in-plane magnetization direction, i.e., more than 50% all crystalline grains can have a respective magnetization direction (e.g., spin orientation) that is parallel to the interface between the continuous tunnel barrier layer and the continuous free layer.

The optional continuous nonmagnetic capping layer includes a nonmagnetic metal that is resistant to oxidation and/or diffusion. In one embodiment, the continuous nonmagnetic capping layer may include a metal having a melting point higher than 1,500 degrees Celsius. For example, the metal of the continuous nonmagnetic capping layer may include ruthenium, tantalum, platinum or gold. The continuous nonmagnetic capping layer may be deposited by a physical vapor deposition. The thickness of the continuous nonmagnetic capping layer may be in a range from 0.5 nm to 2 nm, although lesser and greater thicknesses may also be employed.

The continuous layer stack can be patterned into a two-dimensional array of pillar structures. The patterning can be performed using ion beam milling and/or photolithography and etching. Each of the pillar structures may include a magnetic tunnel junction device 180, which is a magnetic memory device (e.g., an MRAM cell).

In each pillar structure (e.g., in each magnetic tunnel junction device 180 which comprises an MRAM cell), each patterned portion of the continuous SAF structure comprises a SAF structure 120. Each patterned portion of the continuous reference layer comprises a reference layer 132. If the SAF structure 120 includes the superlattice, then the reference layer 132 may contact the nonmagnetic layer of the SAF structure superlattice. Each patterned portion of the continuous tunnel barrier layer comprises a tunnel barrier layer (i.e., tunneling dielectric layer) 134. Each patterned portion of the continuous free layer comprises a free layer 136. Each patterned portion of the continuous magnetoelectric multiferroic layer comprises a magnetoelectric multiferroic layer 140.

A dielectric matrix layer 190 may be deposited over and around the array of magnetic tunnel junction devices 180 (i.e., around the pillar structures). The dielectric matrix layer 190 includes a dielectric material such as silicon nitride, silicon oxide, organosilicate glass, and/or a dielectric metal oxide. In one embodiment, the dielectric matrix layer 190 may include a dielectric diffusion liner (such as a silicon nitride liner) and a dielectric fill material (such as silicon oxide). The dielectric matrix layer 190 may be planarized to provide a horizontal top surface above a horizontal plane including the top surfaces of the magnetic tunnel junction devices 180. For example, chemical mechanical planarization (CMP) may be employed to planarize the top surface of the dielectric matrix layer 190.

Line cavities that laterally extend along a second horizontal direction can be formed in an upper portion of the dielectric matrix layer 190. The second horizontal direction is different from the first horizontal direction, and may be perpendicular to the first horizontal direction. At least one conductive material can be deposited in the line cavities, and excess portions of the at least one conductive material can be removed from above the horizontal plane including the top surface of the dielectric matrix layer 190. Each remaining portion of the at least one conductive material filling the line cavities comprises a second electrically conductive line 90. Each second electrically conductive line 90 can comprise at least one second electrode of the two-dimensional array of magnetic tunnel junction devices 180. Alternatively, the second electrically conductive lines 90 may be formed on each of the pillar structures followed by forming the dielectric matrix layer 190 over the second electrically conductive lines 90.

In one embodiment, each first electrically conductive line 30 can contact a respective row of magnetic tunnel junction devices 180, and each second electrically conductive line 90 can contact a respective column of magnetic tunnel junction devices 180. In this case, each first electrically conductive line 30 can comprise a row of first electrodes, and each second electrically conductive line 90 can comprise a column of second electrodes.

In one embodiment, a predominant subset in volume of the crystalline grains (i.e., a set of crystalline grains that occupy more than 50% of the entire volume of each magnetoelectric multiferroic layer 140) within the magnetoelectric multiferroic layers 140 can have an easy axis of magnetization along an axial direction or along a first tilted direction having a first tilt angle less than 90 degrees relative to the axial direction (such as the <111> direction). The axial direction is perpendicular to each interface between the free layer 136 and the tunnel barrier layer 134 within each magnetic tunnel junction device 180. In one embodiment, each magnetoelectric multiferroic layer 140 can have a respective easy axis of ferroelectric polarization along the axial direction or along a second tilted direction having a second tilt angle less than 90 degrees relative to the axial direction. The second direction of each crystalline grain may, or may not, be parallel or antiparallel to the first direction of the respective crystalline grain. Each magnetoelectric multiferroic layer 140 may be either single crystalline or polycrystalline, i.e., may contain a plurality of crystalline grains that are adjoined at grain boundaries at which crystal structures of the magnetoelectric multiferroic material are discontinuous.

According to an embodiment of the present disclosure, a net axial magnetization can be induced within each magnetoelectric multiferroic layer 140 within the array of magnetic tunnel junction devices 180 by application of an axial initialization magnetic field or electric field. The electric field can switch the ferroelectric polarization and corresponding magnetization due to the magnetoelectric coupling. The axial initialization magnetic field or electric field can be applied along a vertical direction that is perpendicular to the interface between each free layer 136 and the tunnel barrier layer 134. The axial initialization magnetic field or electric field can align the vertical component of the magnetization of each crystalline grain in each magnetoelectric multiferroic layer 140 along the direction of the axial initialization magnetic field or electric field. Thus, each magnetoelectric multiferroic layer 140 can have a net non-zero axial magnetization. In this case, each magnetoelectric multiferroic layer 140 can have a net non-zero ferroelectric polarization that is associated with the net non-zero axial magnetization.

According to another embodiment of the present disclosure, a net axial ferroelectric polarization can be induced within each magnetoelectric multiferroic layer 140 within the array of magnetic tunnel junction devices 180 by application of an axial initialization electric field. The axial initialization electric field can be applied along a vertical direction that is perpendicular to the interface between each free layer 136 and the tunnel barrier layer 134. The axial initialization electric field can align the vertical component of the ferroelectric polarization of each crystalline grain in each magnetoelectric multiferroic layer 140 along the direction of the axial initialization electric field. Thus, each magnetoelectric multiferroic layer 140 can have a net non-zero axial ferroelectric polarization. In this case, each magnetoelectric multiferroic layer 140 can have a net non-zero magnetization that is associated with the net non-zero axial ferroelectric polarization.

According to an aspect of the present disclosure, a magnetic memory device is provided, which comprises: a first electrode (comprising a portion of a first electrically conductive line 30); a second electrode (comprising a portion of a second electrically conductive line 90); and a layer stack (120, 132, 134, 136, 140, 170) located between the first electrode and the second electrode and comprising, from one side to another, a reference layer 132, a tunnel barrier layer 134, a free layer 136, and a magnetoelectric multiferroic layer 140 including at least one crystalline grain having an easy axis of magnetization along an axial direction or along a first tilted direction having a first tilt angle less than 90 degrees relative to the axial direction, the axial direction being perpendicular to an interface between the free layer 136 and the tunnel barrier layer 134.

In one embodiment, the layer stack (120, 132, 134, 136, 140, 170) also comprises a nonmagnetic capping layer 170 including a nonmagnetic metal and contacting the magnetoelectric multiferroic layer 140 and one of the first electrode and the second electrode. In one embodiment, the magnetoelectric multiferroic layer 140 comprises, and/or consist essentially of, at least one material selected from $BiFeO_3$, $h-YMnO_3$, $BaNiF_4$, $PbVO_3$, $BiMnO_3$, $LuFe_2O_4$, $HoMn_2O_5$, $h-HoMnO_3$, $h-ScMnO_3$, $h-ErMnO_3$, $h-TmMnO_3$, $h-YbMnO_3$, $h-LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, or $Ni_3B_7O_{13}I$.

In one embodiment, a two-dimensional array of instances of the magnetic memory device of FIG. 2A or FIG. 2B can be provided. The magnetic memory array can comprise: first electrically conductive lines 30 that are parallel to each other and extend along a first direction, and second electrically conductive lines 90 that are parallel to each other and extend along a second direction that is perpendicular to the first direction. Each of the first electrically conductive lines 30 comprises first electrodes of a respective row of the instances of the magnetic memory device in the magnetic memory array. Each of the second electrically conductive lines 90 comprises second electrodes of a respective column of the instances of the magnetic memory device in the magnetic memory array.

In one embodiment, the magnetoelectric multiferroic layer 140 can have a net non-zero axial magnetization. The net in-plane ferromagnetic moment of the magnetoelectric multiferroic layer 140 may be zero (for axial multiferroic material) or not zero (for canted multiferroic material). Thus, the net in-plane magnetization of the magnetoelectric multiferroic layer 140 may be zero (for axial multiferroic material) or not zero (for canted multiferroic material).

Figure 3A:
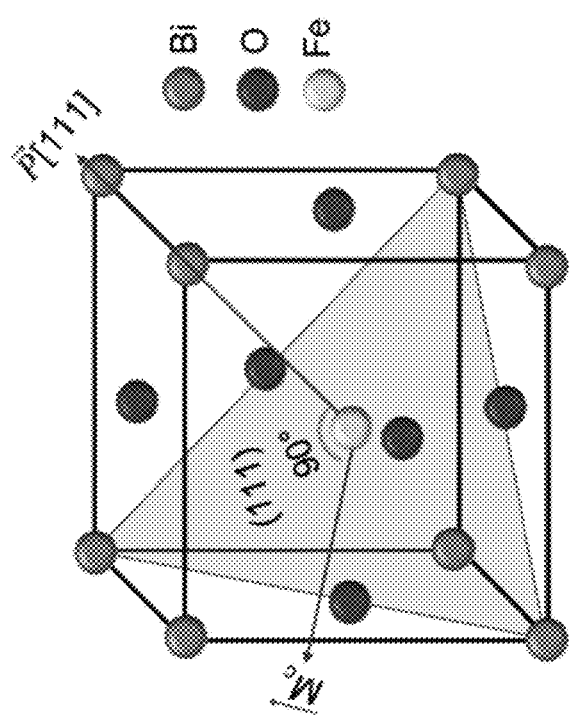
FIG. 3A is a perspective view of a unit cell of $BiFeO_3$ with ferroelectric polarization and magnetic moment
Figure 3B:
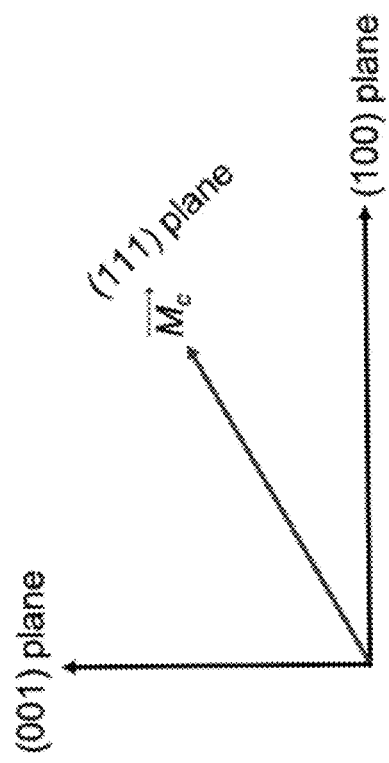
FIG. 3B illustrates the relative spatial orientation between the ferroelectric polarization and the magnetic moment directions of the unit cell of $BiFeO_3$ of FIG. 3A.

FIG. 3A illustrates a cubic unit cell of $BiFeO_3$ with a direction of ferroelectric polarization P along one of the <111> family directions (e.g., the [111] direction) and a canted magnetic moment direction Mc within the (111) plane. FIG. 3B illustrates the in plane (100) and out of plane (001) components of the magnetic moment direction Mc in the (111) plane. The relative spatial orientation (e.g., 90 degree angle) between the magnetic moment direction Mc and the polarization direction P is the same for each magnetoelectric multiferroic unit cell. The out of plane (001) component of the canted magnetic moment direction Mc of each multiferroic portion is magnetically coupled to the magnetization direction of corresponding free layer via exchange bias or coupling (e.g., ferromagnetic or antiferromagnetic coupling) at their interface.

In one embodiment, the easy axis of magnetization of polycrystalline grains of the magnetoelectric multiferroic layer 140 may be along the axial direction. In another embodiment, the easy axis of magnetization of polycrystalline grains of the magnetoelectric multiferroic layer 140 may be along a respective first tilted (i.e., canted) direction, such as one of the <111> directions.

Figure 4A:
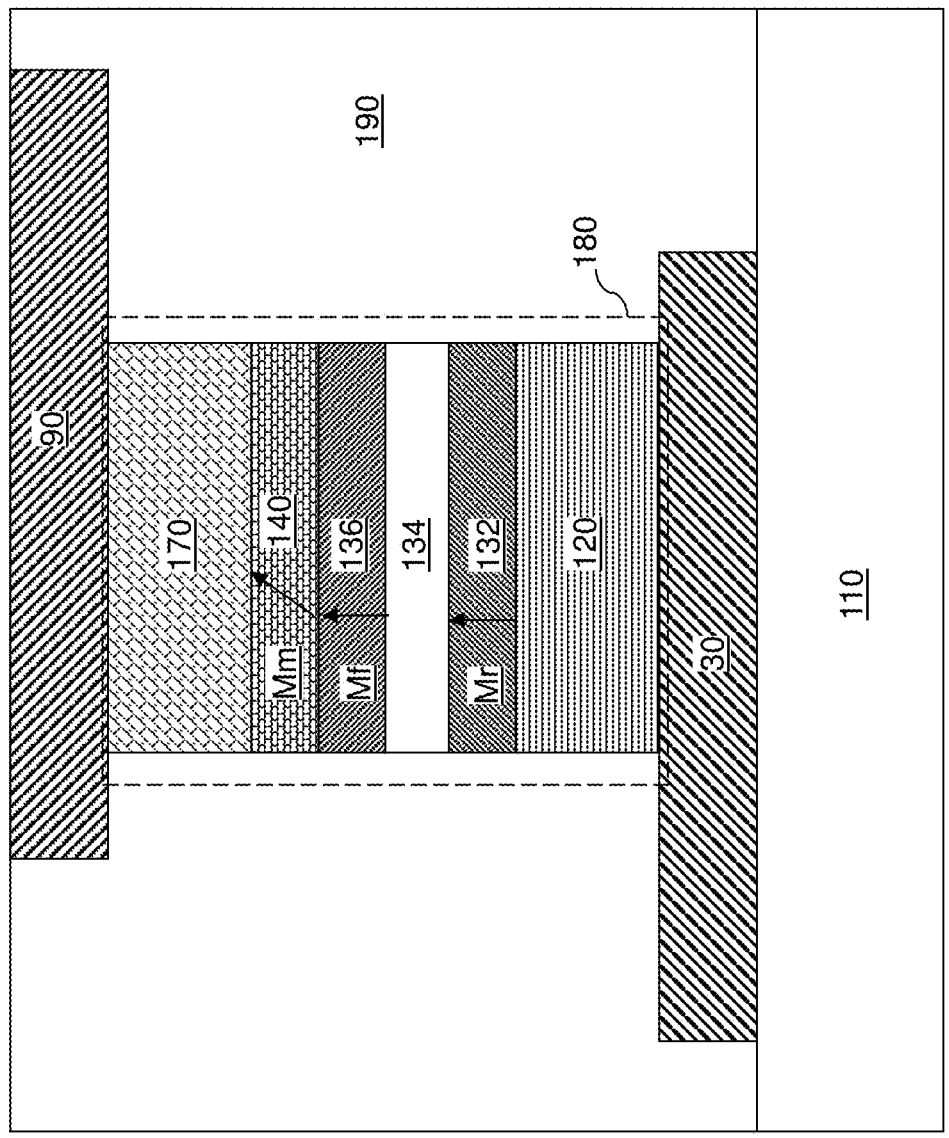
FIG. 4A is a vertical cross-sectional view of the first exemplary structure in a first programmed state according to the first embodiment of the present disclosure.
Figure 4B:
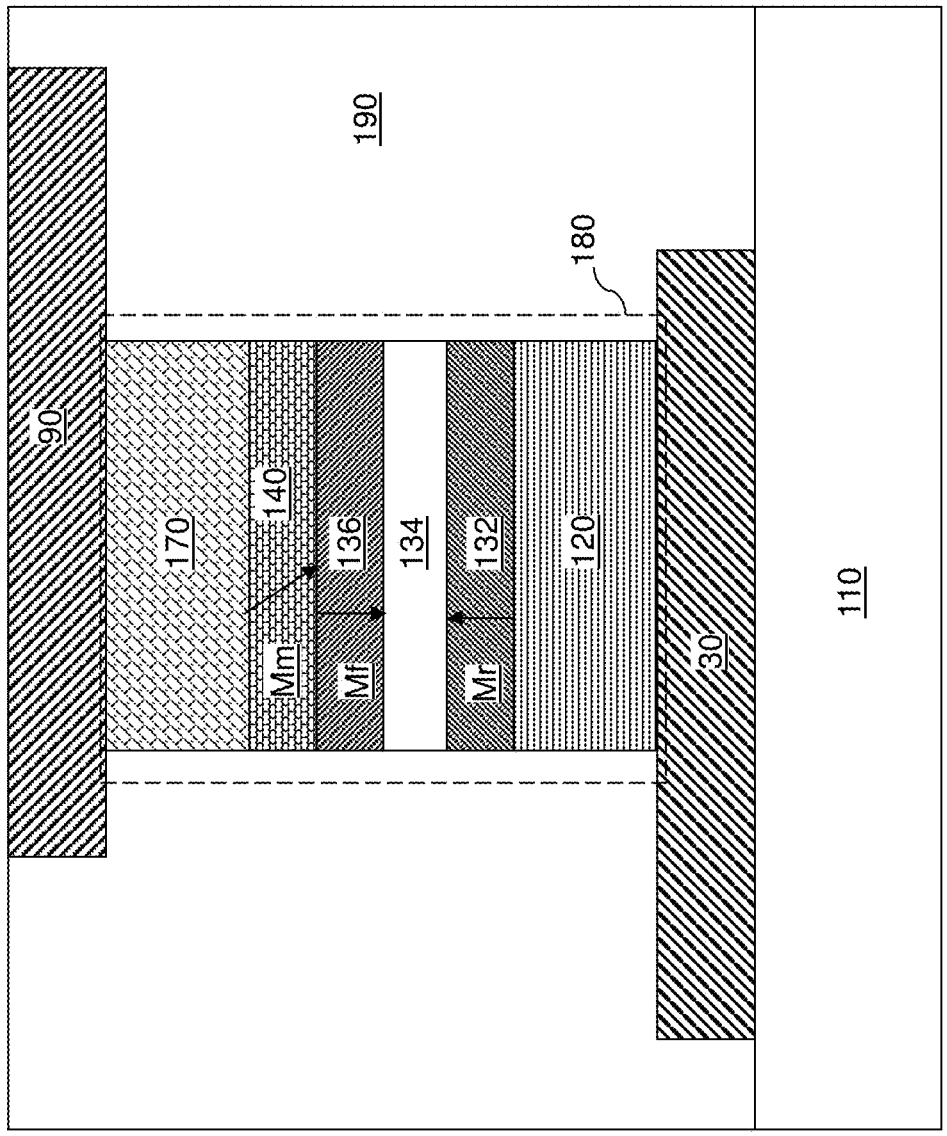
FIG. 4B is a vertical cross-sectional view of the first exemplary structure in a second programmed state according to the first embodiment of the present disclosure.

Referring to FIGS. 4A and 4B, magnetic states (which correspond to magnetoresistance states) of a magnetic tunnel junction device 180 in the first exemplary structure are illustrated. FIG. 4A illustrates a first magnetic state of the magnetic tunnel junction device 180, and FIG. 4B illustrates a second magnetic state of the magnetic tunnel junction device 180. The magnetization direction Mm of the magnetoelectric multiferroic layer 140 is magnetically coupled to the magnetization direction Mf of the free layer 136. Thus, in each of the first magnetic state and the second magnetic state of the magnetic tunnel junction device 180, the magnetization direction Mm of the magnetoelectric multiferroic layer 140 can be aligned to the magnetization direction Mf of the free layer 136. In FIG. 4A, the magnetization direction Mf of the free layer 136 is parallel to the magnetization direction Mr of the reference layer 132. Thus, the magnetic tunnel junction device 180 (e.g., MRAM cell) is in the lower resistance state. In FIG. 4B, the magnetization direction Mf of the free layer 136 is antiparallel to the magnetization direction Mr of the reference layer 132. Thus, the magnetic tunnel junction device 180 (e.g., MRAM cell) is in the higher resistance state.

Figure 5:
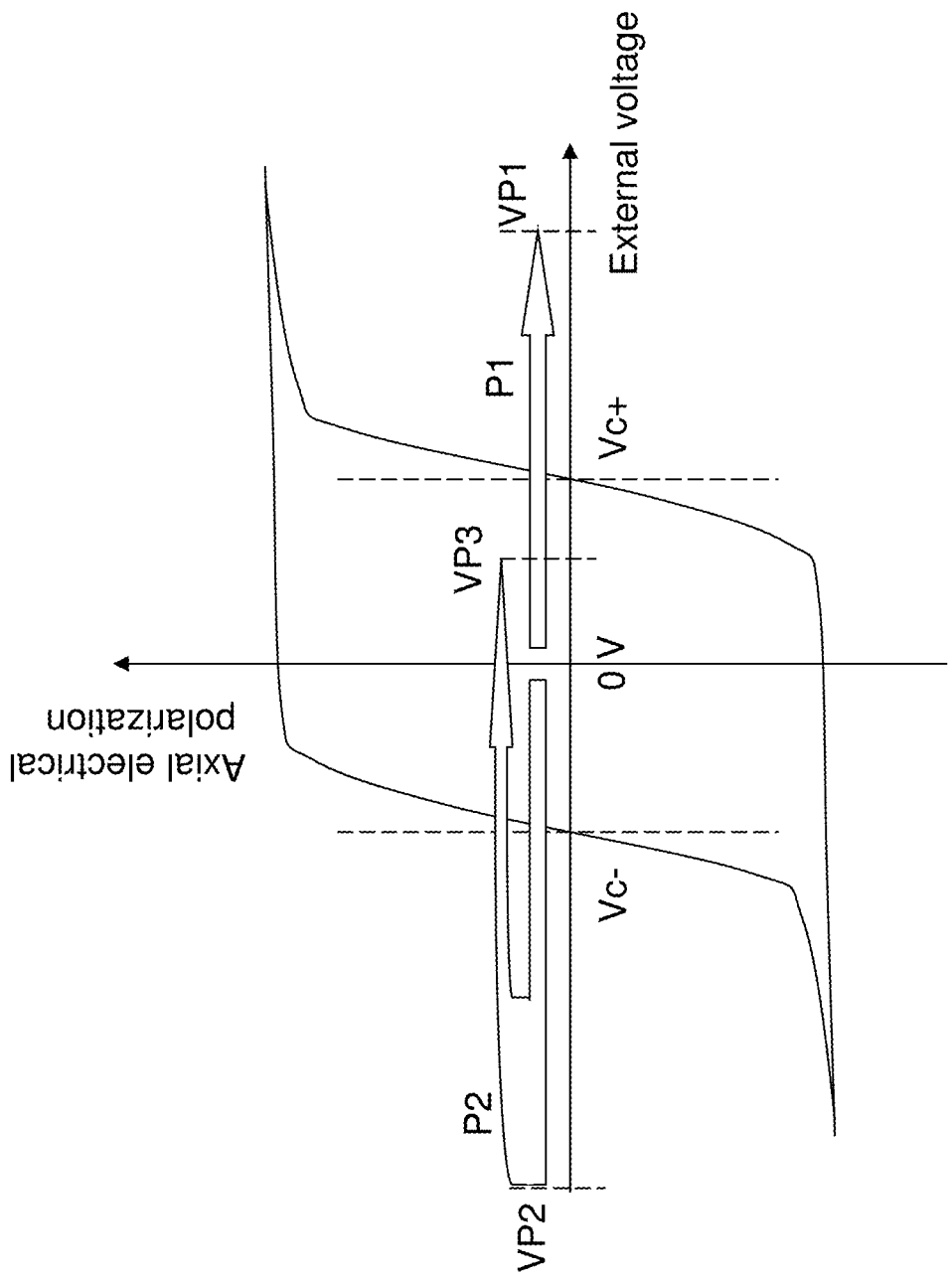
FIG. 5 is a diagram illustrating changes in the axial ferroelectric polarization of the magnetoelectric multiferroic layer according to the first embodiment of the present disclosure.

Referring to FIG. 5, the programming mechanism for the magnetic memory device illustrated in FIGS. 4A and 4B is schematically illustrated. FIG. 5 illustrates the hysteresis curve for the axial electrical polarization of the magnetoelectric multiferroic layer 140 as a function of an external voltage applied across the second electrode and the first electrode, i.e., the external voltage as applied to the second electrode with respect to the first electrode. The direction of magnetization Mm of the magnetoelectric multiferroic layer 140 can be switched upon application of an electric voltage across the magnetoelectric multiferroic layer 140 that exceeds the magnitude of the coercive voltage (which may be Vc+ or Vc− depending on the polarity) of the magnetoelectric multiferroic material of the magnetoelectric multiferroic layer 140. The positive coercive voltage Vc+ and the negative coercive voltage Vc− may have equal magnitudes, and may differ from each other by the polarity.

FIG. 6A illustrates a first programming voltage pattern P1 that can be employed to program the magnetic tunnel junction device 180 into the lower resistance state in the configuration shown in FIG. 4A. FIG. 6B illustrates a second programming voltage pattern P2 that can be employed to program magnetic tunnel junction device 180 into the higher resistance state shown in FIG. 4B.

Referring to FIGS. 5 and 6A, the first programming voltage pattern P1 includes a first polarity voltage having a magnitude greater than the coercive voltage which is applied to magnetic tunnel junction device 180 between the first and second electrodes. In the embodiment of FIGS. 5 and 6A, the first polarity voltage is a positive voltage VP1 having a magnitude greater than the coercive voltage (Vc+) which is applied to magnetic tunnel junction device 180 between the first and second electrodes. However, it should be understood that in an alternative embodiment, the first polarity voltage can be a negative voltage having a magnitude greater than the coercive voltage. The positive voltage deterministically programs the magnetization direction Mm of the magnetoelectric multiferroic layer 140 to be parallel to magnetization direction Mr of the reference layer 132. Furthermore, the positive voltage has a sufficient magnitude to lower the perpendicular magnetic anisotropy ("PMA") and magnetic anisotropy barrier height at the interface between the tunnel barrier layer 134 and the free layer 136 to allow the free layer 136 to deterministically switch its magnetization direction Mf. Since the magnetization direction Mf of the free layer 136 is coupled to the magnetization direction Mm of the magnetoelectric multiferroic layer 140, the magnetization direction Mf of the free layer 136 is aligned to the direction of the magnetization of the Mm of the magnetoelectric multiferroic layer 140. Therefore, the magnetization direction Mf of the free layer 136 is deterministically programmed to be parallel to magnetization direction Mr of the reference layer 132, as shown in FIG. 4A. Thus, the magnetic tunnel junction device 180 is deterministically programmed into the lower resistance state.

Referring to FIGS. 5 and 6B, the second programming voltage pattern P2 includes a second polarity voltage opposite to the first polarity voltage having a magnitude greater than the coercive voltage which is applied to magnetic tunnel junction device 180 between the first and second electrodes. In the embodiment of FIGS. 5 and 6B, the second polarity voltage is a negative voltage VP2 having a magnitude greater than the coercive voltage (Vc−) which is applied to magnetic tunnel junction device 180 between the first and second electrodes. However, it should be understood that in an alternative embodiment, the second polarity voltage can be a positive voltage having a magnitude greater than the coercive voltage. The negative voltage deterministically programs the magnetization direction Mm of the magnetoelectric multiferroic layer 140 to be antiparallel to magnetization direction Mr of the reference layer 132. However, the negative voltage increases the perpendicular magnetic anisotropy ("PMA") and magnetic anisotropy barrier height at the interface between the tunnel barrier layer 134 and the free layer 136 such that the free layer 136 cannot switch its magnetization direction Mf.

Therefore, the second programming voltage pattern P2 also includes a first polarity voltage having a magnitude less than the coercive voltage which is applied to magnetic tunnel junction device 180 between the first and second electrodes. In the embodiment of FIGS. 5 and 6B, the first polarity voltage is a positive voltage VP3 having a magnitude less than the coercive voltage (Vc+) which is applied to magnetic tunnel junction device 180 between the first and second electrodes. However, it should be understood that in an alternative embodiment, the first polarity voltage can be a negative voltage having a magnitude less than the coercive voltage. The positive voltage VP3 does not have a sufficient magnitude to switch the magnetization direction Mm of the magnetoelectric multiferroic layer 140. However, the positive voltage VP3 does have a sufficient magnitude to lower the perpendicular magnetic anisotropy ("PMA") and magnetic anisotropy barrier height at the interface between the tunnel barrier layer 134 and the free layer 136 to allow the free layer 136 to deterministically switch its magnetization direction Mf. Since the magnetization direction Mf of the free layer 136 is coupled to the magnetization direction Mm of the magnetoelectric multiferroic layer 140, the magnetization direction Mf of the free layer 136 is aligned to the direction of the magnetization of the Mm of the magnetoelectric multiferroic layer 140. Therefore, the magnetization direction Mf of the free layer 136 is deterministically programmed to be antiparallel to magnetization direction Mr of the reference layer 132, as shown in FIG. 4B. Thus, the magnetic tunnel junction device 180 is deterministically programmed into the higher resistance state when the negative voltage pulse VP2 is followed by the smaller positive voltage pulse VP3.

Referring to FIGS. 5, 6A and 6B, the positive voltage pulse VP1 may have a magnitude between 0.5 V and 2 V, the negative voltage pulse VP2 may have a magnitude between −0.5 V and −2 V, and the third positive voltage pulse VP3 may have a magnitude between 0.3 V and 1 V, and which has an absolute value which is less than an absolute value of the negative voltage pulse VP2.

Generally, the magnetic memory device of the embodiments present disclosure can comprise a programming circuit, such as a component of the sensing and programming circuit 570 of the random access memory device 501 of FIG.

1 which applies the avoid voltages. Alternatively, each magnetic tunnel junction device 180 may be individually connected to a respective programming circuit configured to program a single magnetic tunnel junction device 180.

Figure 7A:
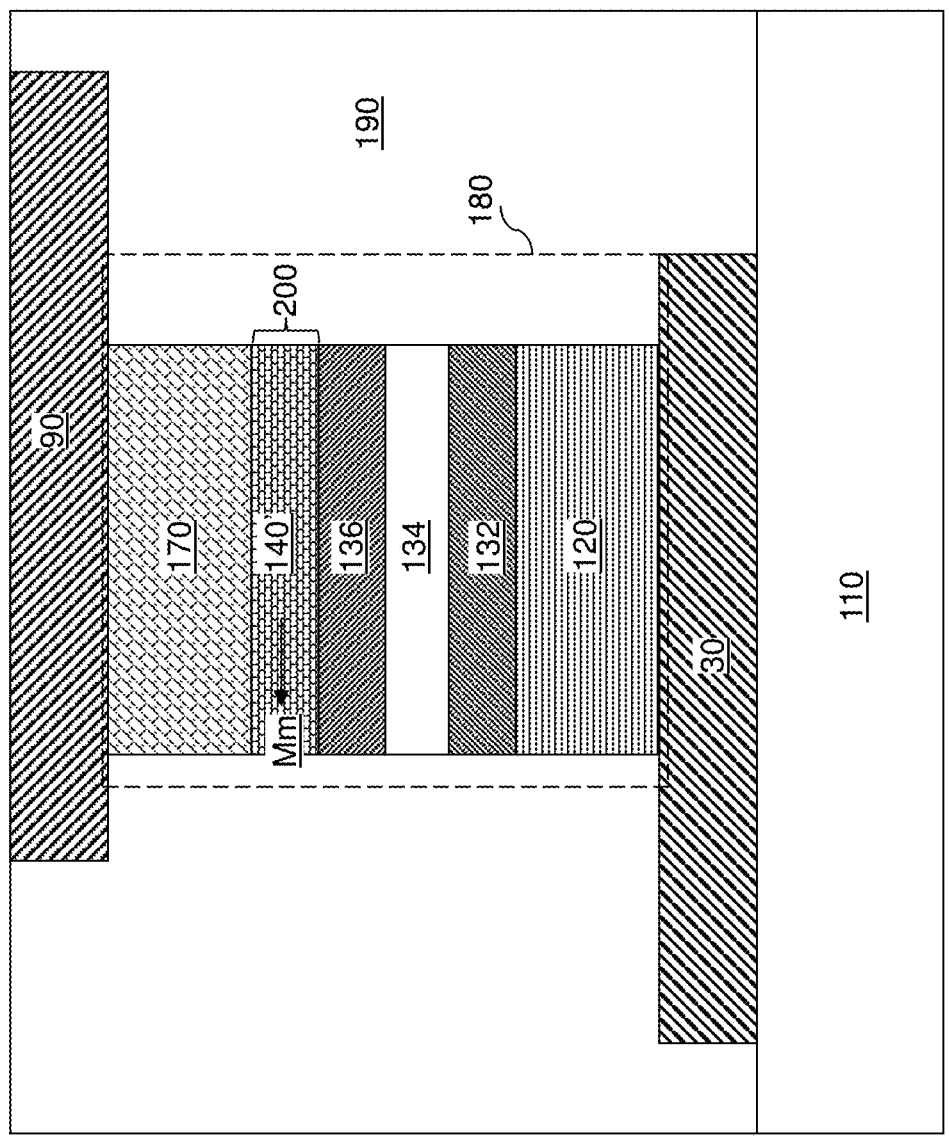
FIG. 7A is a vertical cross-sectional view of a second exemplary structure after formation according to a first embodiment of the present disclosure.
Figure 7B:
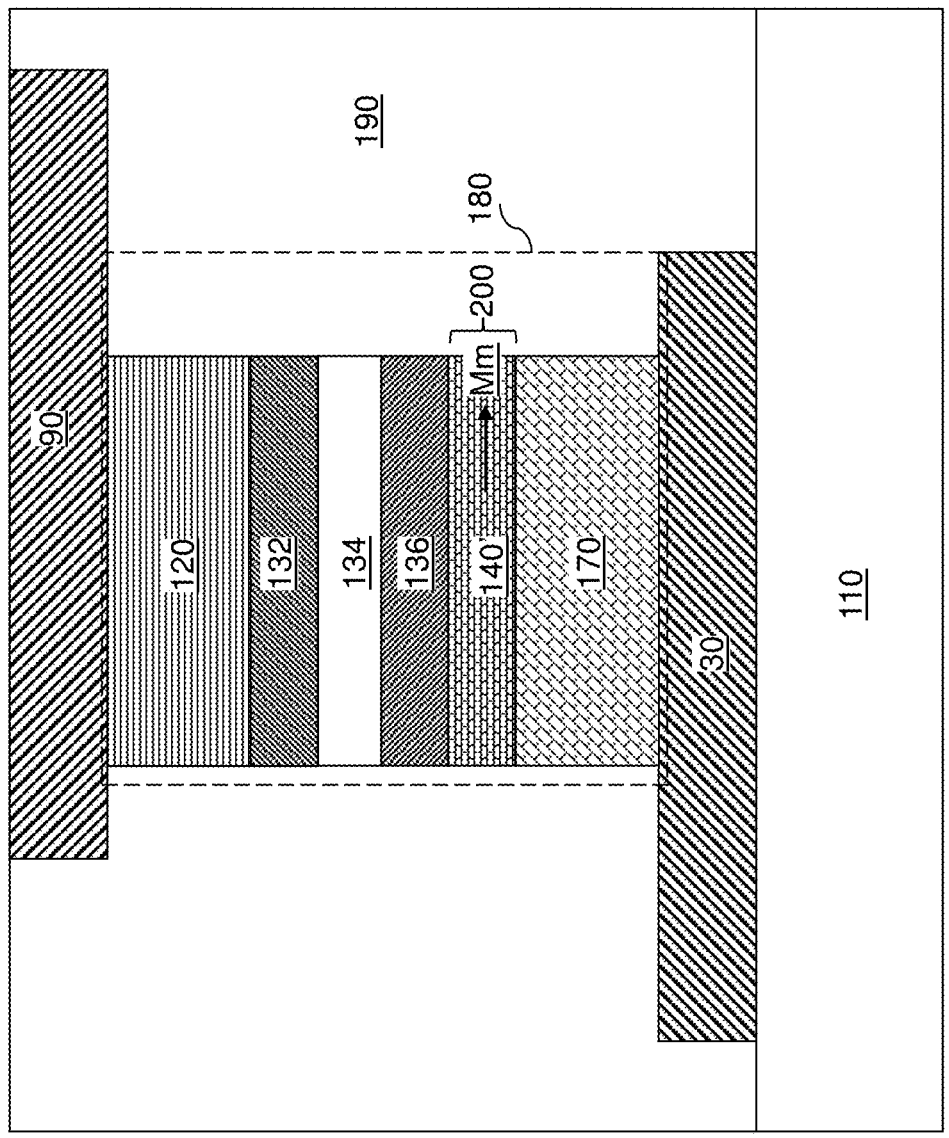
FIG. 7B is a vertical cross-sectional view of an alternative embodiment of the second exemplary structure according to the first embodiment of the present disclosure.

Referring to FIGS. 7A and 7B, configurations of a second exemplary structure according to a second embodiment of the present disclosure are illustrated. The configurations of the second exemplary structure may be derived from the configurations of the first exemplary structure illustrated in FIGS. 2A and 2B by replacing the magnetoelectric multiferroic layer 140 with a VCMA assist structure 200 having an in-plane magnetization direction. In the configuration of FIGS. 7A and 7B, the VCMA assist structure 200 comprises a magnetoelectric multiferroic layer 140' having an in-plane magnetization direction Mm. The in-plane magnetization provides an in-plane magnetic dipolar magnetic field for VCMA precessional switching. Layer 140' may comprise a polycrystalline $BiFeO_3$ layer having a preferred grain orientation along the (111) plane can provide predominantly in-plane magnetization direction, i.e., more than 50% all crystalline grains can have a respective magnetization direction (e.g., spin orientation) that is parallel to the interface between the tunnel barrier layer 134 and the free layer 136.

A net in-plane magnetization of the magnetoelectric multiferroic layer 140' can be induced by application of an in-plane magnetic field or by application of an out-of-plane external electric field. Thus, a predominant portion (i.e., more than 50% in volume) of the crystalline grains of the magnetoelectric multiferroic layer 140' can have a net non-zero in-plane magnetization. In this case, each magnetoelectric multiferroic layer 140' can have a net non-zero ferroelectric polarization that is associated with the net non-zero in-plane magnetization. In other words, the net in-plane magnetization of each magnetoelectric multiferroic layer 140' can be induced by applying external magnetic field along an in-plane direction that is parallel to the interface between the free layer 136 and the tunnel barrier layer 134. A net in-plane ferroelectric polarization of the magnetoelectric multiferroic layer 140' and the net in-plane magnetization of the magnetoelectric multiferroic layer 140' can be simultaneously induced by the external magnetic field.

According to another embodiment of the present disclosure, a net in-plane ferroelectric polarization can be induced within each magnetoelectric multiferroic layer 140' within the array of magnetic tunnel junction devices 180 by application of an in-plane or out-of plane initialization electric field. The in-plane initialization electric field can be applied along a horizontal direction that is parallel to the interface between each free layer 136 and the tunnel barrier layer 134. The in-plane initialization electric field can align the in-plane component of the ferroelectric polarization of each crystalline grain in each magnetoelectric multiferroic layer 140' along the direction of the in-plane initialization electric field. Thus, each magnetoelectric multiferroic layer 140' can have a net non-zero in-plane ferroelectric polarization. In this case, each magnetoelectric multiferroic layer 140' can have a net non-zero in-plane magnetization that is associated with the net non-zero in-plane ferroelectric polarization. In other words, the net in-plane magnetization of each magnetoelectric multiferroic layer 140' can be induced by applying external electric field along an in-plane direction that is parallel to the interface between the free layer 136 and the tunnel barrier layer 134. A net in-plane ferroelectric polarization of each magnetoelectric multiferroic layer 140' and the net in-plane magnetization of each magnetoelectric multiferroic layer 140' can be simultaneously induced by the external electric field.

Generally, the magnitude of the net in-plane magnetization of each magnetoelectric multiferroic layer 140' can be greater than the magnitude of any net axial magnetization of the respective magnetoelectric multiferroic layer 140' by at least one order of magnitude, i.e., by a factor greater than 10 such as by a factor greater than 30 or 100.

Figure 8:
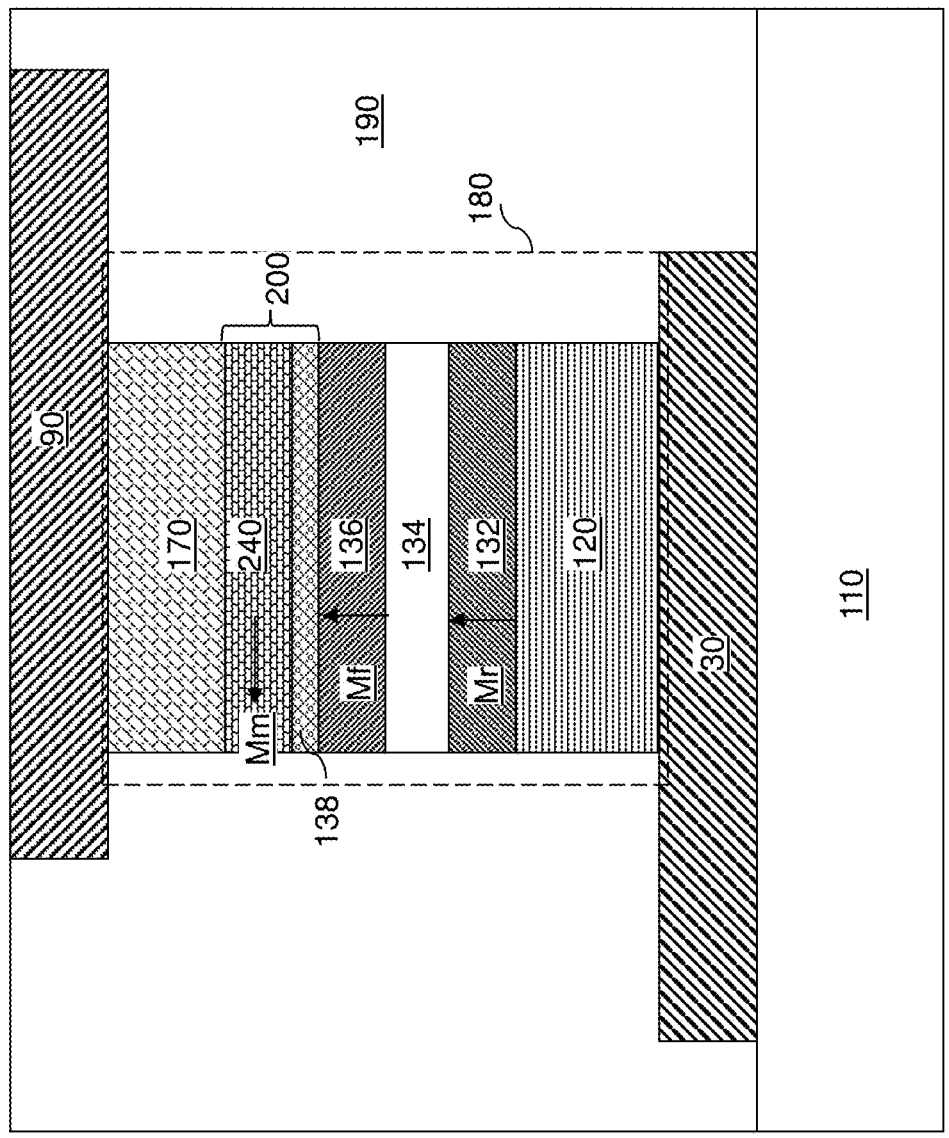
FIG. 8 is a vertical cross-sectional view of another alternative embodiment of the second exemplary structure according to the second embodiment of the present disclosure.

Referring to FIG. 8, an alternative configuration of the second exemplary structure is illustrated, which can be derived from the configurations of the second exemplary structure illustrated in FIGS. 7A and 7B by using a VCMA assist structure 200 which comprises a ferromagnetic or ferrimagnetic layer 240 having an in-plane magnetization direction and an electrically conductive nonmagnetic spacer layer 138 located between the free layer 136 and the ferromagnetic or ferrimagnetic layer 240. The ferromagnetic or ferrimagnetic layer 240 may comprise a CoFe or CoFeB ferromagnetic layer or a $Fe_3O_4$ ferrimagnetic layer. The electrically conductive nonmagnetic spacer layer 138 may comprise any suitable nonmagnetic metal layer, such as Pt, Ta, Ru, W, etc. The thickness of each of layers 238 and 240 may be between 1 nm and 2 nm, although lesser and greater thicknesses may also be employed Referring collectively to FIGS. 7A, 7B, and 8, a magnetic memory device is provided, which comprises: a first electrode (comprising portion of a first electrically conductive line 30); a second electrode (comprising portion of a second electrically conductive line 90); and a layer stack (optional 120, 132, 134, 136, 200, optional 170) located between the first electrode and the second electrode and comprising, from one side to another, a reference layer 132 having a fixed axial magnetization direction, a tunnel barrier layer 134, a free layer 136 having an easy axis of magnetization that is parallel or antiparallel to the fixed axial magnetization direction, and a VCMA assist structure 200 having an in-plane magnetization direction.

In one embodiment, the VCMA assist structure comprises a magnetoelectric multiferroic layer 140' including at least one crystalline grain which has an easy axis of magnetization that is parallel to an interface between the free layer 136 and the tunnel barrier layer 134, and a net in-plane magnetization of the magnetoelectric multiferroic layer 140' is non-zero.

In one embodiment, the magnetoelectric multiferroic layer 140' has a net ferroelectric polarization that is parallel to the interface between the free layer 136 and the tunnel barrier layer 134. In one embodiment, the magnetoelectric multiferroic layer 140' can be polycrystalline, and a predominant subset in volume of crystalline grains i.e., a set of crystalline grains that occupy more than 50% of the entire volume of the magnetoelectric multiferroic layer 140) within the magnetoelectric multiferroic layer 140' can have a respective magnetization direction that is aligned, or has an angle less than 145 degrees from, a direction of the net in-plane magnetization of the magnetoelectric multiferroic layer 140'. In one embodiment, the net in-plane magnetization of the magnetoelectric multiferroic layer 140' can be parallel to, or is antiparallel to, the direction of the net in-plane magnetization of the magnetoelectric multiferroic layer 140'.

In one embodiment, the magnetoelectric multiferroic layer 140' comprises a material selected from $BiFeO_3$, h-$YMnO_3$, $BaNiF_4$, $PbVO_3$, $BiMnO_3$, $LuFe_2O_4$, $HoMn_2O_5$, h-$HoMnO_3$, h-$ScMnO_3$, h-$ErMnO_3$, h-$TmMnO_3$, h-$YbMnO_3$, h-$LuMnO_3$, $K_2SeO_4$, $Cs_2CdI_4$, $TbMnO_3$, $Ni_3V_2O_8$, $MnWO_4$, CuO, $ZnCr_2Se_4$, $LiCu_2O_2$, and $Ni_3B_7O_{13}I$. For example, the magnetoelectric multiferroic layer 140' comprises a BiFeO₃ layer having a (111) preferred grain orientation and a thickness of 1 nm or less.

In one embodiment, the layer stack also includes the SAF structure 120. In one embodiment, the layer stack (optional 120, 132, 134, 136, 200, optional 170) comprises a non-magnetic capping layer 170 including a nonmagnetic metal contacting the magnetoelectric multiferroic layer 140' and one of the electrode and the second electrode.

In another embodiment illustrated in FIG. 8, the VCMA assist structure 200 comprises a ferromagnetic or ferrimagnetic layer 240 having an in-plane magnetization direction and an electrically conductive nonmagnetic spacer layer 138 located between the free layer 136 and the ferromagnetic or ferrimagnetic layer 240.

Figure 9A:
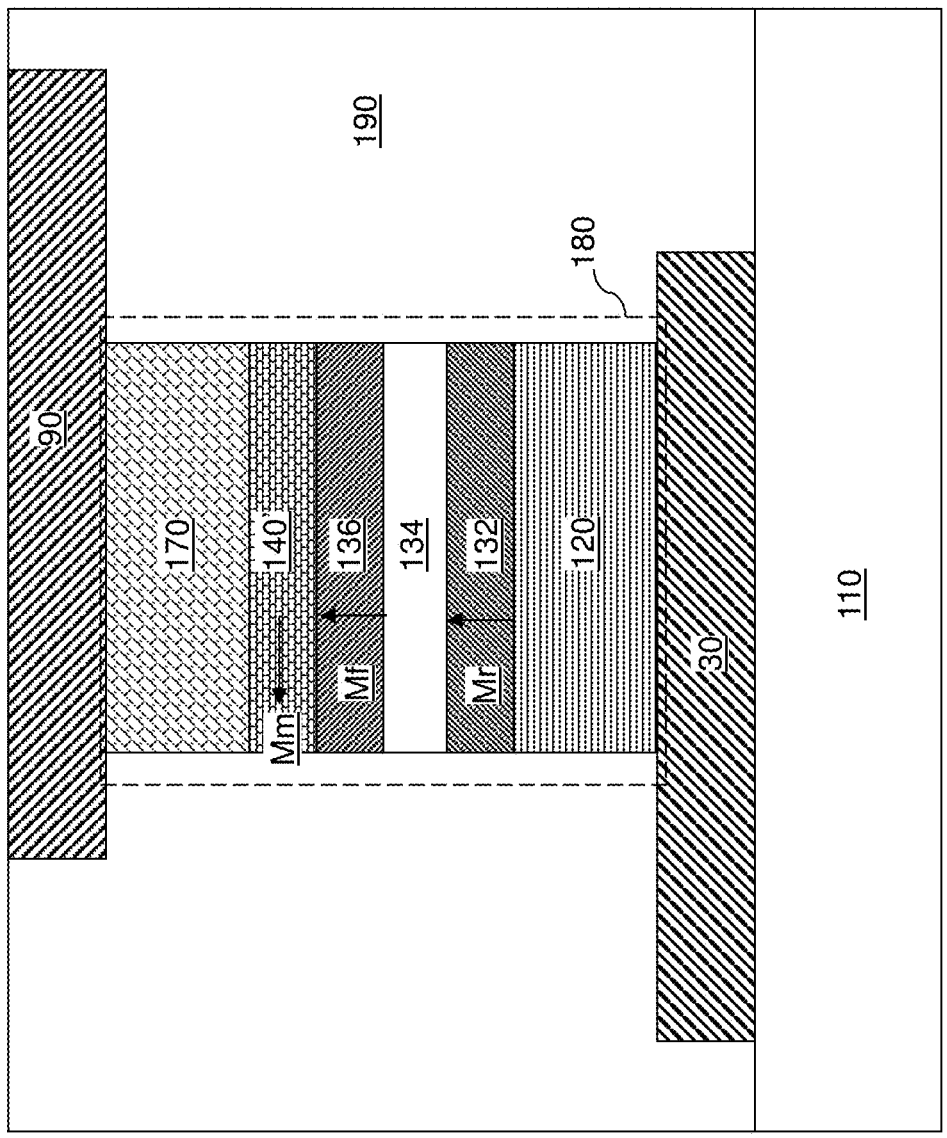
FIG. 9A is a vertical cross-sectional view of a second exemplary structure in a first magnetic state according to a second embodiment of the present disclosure.
Figure 9B:
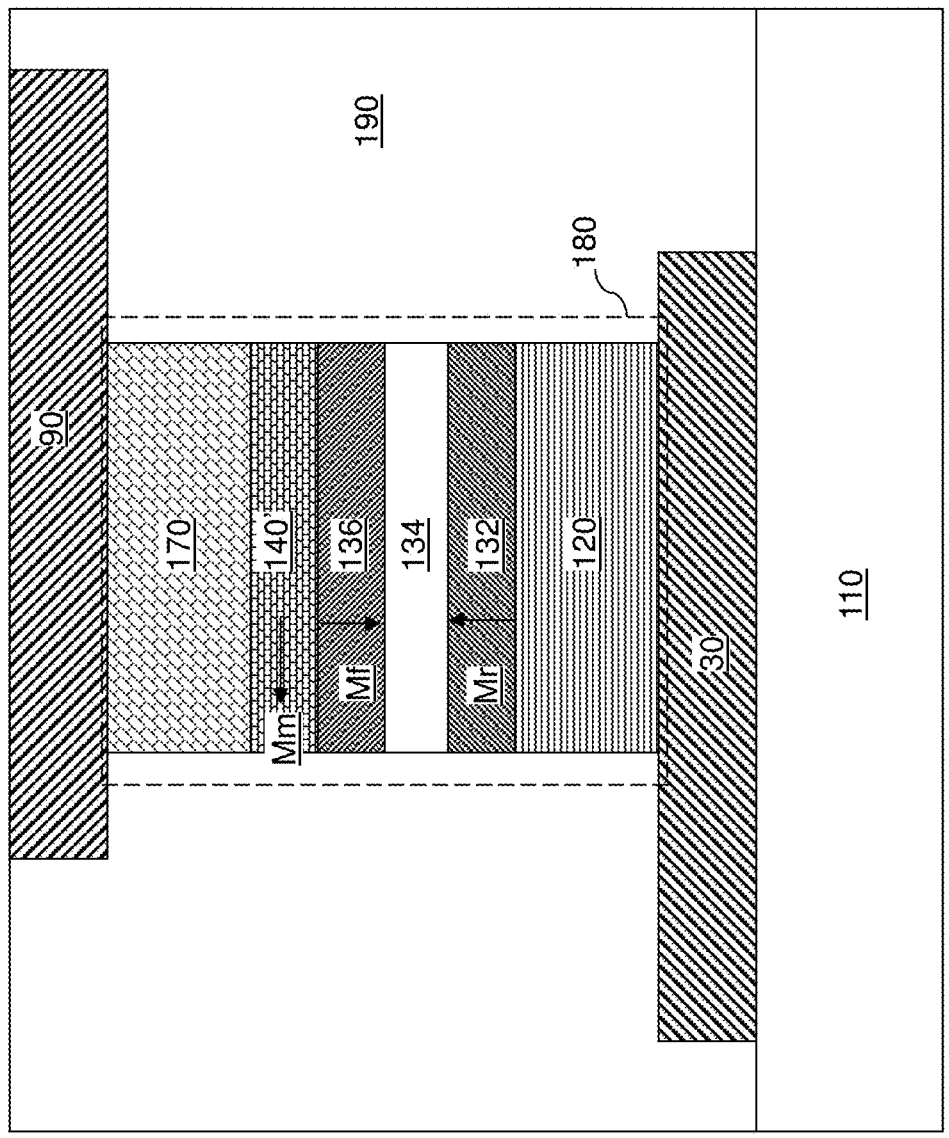
FIG. 9B is a vertical cross-sectional view of the second exemplary structure in a second magnetic state according to the second embodiment of the present disclosure.

Referring to FIGS. 9A and 9B, a first programmed state and a second programmed state of a second exemplary structure is illustrated. FIG. 9A illustrates the first programmed state, and FIG. 9B illustrates the second programmed state. The first programmed state (e.g., the lower resistance state) has a parallel alignment between the magnetization Mf of the free layer 136 and the magnetization Mr of the reference layer 132. The second programmed state (e.g., the higher resistance state) has an antiparallel alignment between the magnetization Mf of the free layer 136 and the magnetization Mr of the reference layer 132. The first programmed state of FIG. 9A and the second programmed state of FIG. 9B have different tunneling magnetoresistance values. Thus, the magnetic state of the magnetic tunnel junction device 180 in the second exemplary structure can be determined by applying a low voltage sensing bias voltage across the second electrode and the first electrode, and measuring the magnitude of the tunneling current through the magnetic tunnel junction device 180.

Referring to FIG. 10A, the second exemplary structure can include a sensing circuit (which may be a component of the sensing and programming circuit 570 illustrated in FIG. 1 or may be a stand-alone sensing circuit) configured to determine tunneling magnetoresistance of the layer stack (optional 120, 132, 134, 136, 200, optional 170) between the first electrode and the second electrode. The sensing circuit can be configured to determine whether the memory state of the magnetic memory device (i.e., the magnetic tunnel junction device 180) is in a target state or not by comparing a measured value of the tunneling magnetoresistance of the layer stack to a target value, which may be the target value for the parallel state illustrated in FIG. 9A or the target value for the antiparallel state illustrated in FIG. 9B.

The sensing circuit can be configured to apply a sensing pulse Vs of a first polarity. The first polarity can be selected such that the sensing pulse Vs increases perpendicular magnetic anisotropy of the free layer 136. In other words, the magnetization of the free layer 136 is less likely to make a transition between a parallel state and an antiparallel state. Thus, the sensing operation does not disturb the magnetic state of the magnetic tunnel junction device 180 of the second exemplary structure. For example, the sensing pulse may comprise a negative voltage pulse. In one embodiment, the absolute magnitude of the voltage of the sensing pulse Vs may be in a range from 0.05 V to 0.5 V such as from 0.1 V to 0.2 V, although lesser and greater voltages may also be employed.

In case the sensing operation determines that the measured magnetic state of the magnetic tunnel junction device 180 is the same as the target magnetic state for the magnetic tunnel junction device 180, no further action is necessary.

Referring to FIG. 10B, in case the sensing operation determines that the measured magnetic state of the magnetic tunnel junction device 180 is the opposite of the target magnetic state of the magnetic tunnel junction device 180, a programming circuit may be employed to program the magnetic tunnel junction device 180 into the target magnetic state. The programming circuit may be a component of the sensing and programming circuit 570 illustrated in FIG. 1, or may be a discrete circuit configured to program a single magnetic tunnel junction device 180. The programming circuit can be configured to apply a VCMA programming voltage pulse Vp that induces precession of an angle between the magnetization direction of the free layer 136 and an axial direction that is perpendicular to the interface between the free layer 136 and the tunnel barrier layer 134 if, the magnetic memory device is not in the target state, and can be configured not to apply any programming voltage pulse if the magnetic memory device is in the target state.

The VCMA programming voltage pulse Vp non-deterministically programs the magnetic memory device without applying an external magnetic field. The VCMA programming voltage pulse Vp can have a second polarity that is an opposite of the first polarity. The programming voltage pulse Vp reduces the perpendicular magnetic anisotropy of the free layer 136. Thus, the programming voltage pulse Vp enables movement of the direction of the magnetization of the free layer 136. For example, the programming voltage Vp can be a 0.3 V to 1 V positive voltage pulse which has a greater absolute magnitude than the sensing pulse Vs.

The various embodiments of the present disclosure can be employed to provide a voltage controlled magnetic anisotropy (VCMA) tunnel magnetoresistance (TMR) memory device. The VCMA TMR device may have a deterministic switching mechanism as in the case of the first exemplary structure, or may have a pulse duration-controlled switching mechanism as in the case of the second exemplary structure. The outcome of programming is independent of the variations in the pulse magnitude or pulse duration in the case of the first exemplary structure due to the deterministic nature of the programming mechanism. The VCMA assist structure of the second exemplary structure provides a predictable and well controlled stray magnetic field (residual magnetic field) that determines the precession frequency of the angle between the magnetization of the free layer 136 and the vertical axis, thereby improving the accuracy and reliability of VCMA programming that switches the magnetic states. Furthermore, when the VCMA assist structure includes the in-plane multiferroic layer 140', such multiferroic layer can provide additional PMA to free layer due to the hybridization of oxygen orbitals and metal 3d orbital.

Furthermore, the multiferroic layer, such as BiFeO₃, has a smaller resistivity than the typical tunnel barrier material (e.g., MgO). Since the multiferroic layer has similar thickness as the tunnel barrier layer, the multiferroic layer does not significantly increase the resistance of the memory device (i.e., does not add a significant parasitic resistance). Therefore, a relatively small sense voltage may be used to read the memory device without disturbing the written magnetic state similar to conventional VCMA MRAMs which lack a multiferroic layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetic memory device, comprising:
a first electrode;
a second electrode; and
a layer stack located between the first electrode and the second electrode and comprising, from one side to another, a reference layer, a tunnel barrier layer, a free layer, and a voltage controlled magnetic anisotropy (VCMA) assist structure having an in-plane magnetization direction, wherein the VCMA assist structure comprises a magnetoelectric multiferroic layer including at least one crystalline grain having an easy axis of magnetization that is parallel to an interface between the free layer and the tunnel barrier layer, and a net in-plane magnetization of the magnetoelectric multiferroic layer is non-zero.

2. The magnetic memory device of claim 1, wherein the magnetoelectric multiferroic layer has a net ferroelectric polarization that is parallel to the interface between the free layer and the tunnel barrier layer.

3. The magnetic memory device of claim 1, wherein the magnetoelectric multiferroic layer is polycrystalline, wherein a predominant subset in volume of crystalline grains within the magnetoelectric multiferroic layer has a respective magnetization direction that is aligned to, or has an angle less than 145 degrees from a direction of the net in-plane magnetization of the magnetoelectric multiferroic layer.

4. The magnetic memory device of claim 3, wherein the net in-plane magnetization of the magnetoelectric multiferroic layer is parallel to or is antiparallel to the direction of the net in-plane magnetization of the magnetoelectric multiferroic layer.

5. The magnetic memory device of claim 1, wherein the magnetoelectric multiferroic layer comprises a material selected from $BiFeO_3$, $h\text{-}YMnO_3$, $BaNiF_4$, $PbVO_3$, $BiMnO_3$, $LuFe_2O_4$, $HoMn_2O_5$, $h\text{-}HoMnO_3$, $h\text{-}ScMnO_3$, $h\text{-}ErMnO_3$, $h\text{-}TmMnO_3$, $h\text{-}YbMnO_3$, $h\text{-}LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, and $Ni_3B_7O_{13}I$.

6. The magnetic memory device of claim 5, wherein the magnetoelectric multiferroic layer comprises a $BiFeO_3$ layer having a (111) preferred grain orientation and a thickness of 1 nm or less.

7. The magnetic memory device of claim 1, wherein the VCMA assist structure comprises a ferromagnetic layer having an in-plane magnetization direction and an electrically conductive nonmagnetic spacer layer located between the free layer and the ferromagnetic layer.

8. The magnetic memory device of claim 1, wherein the VCMA assist structure comprises a ferrimagnetic layer having an in-plane magnetization direction and an electrically conductive nonmagnetic spacer layer located between the free layer and the ferrimagnetic layer.

9. The magnetic memory device of claim 1, wherein the layer stack further comprises a nonmagnetic capping layer including a nonmagnetic metal contacting the magnetoelectric multiferroic layer and one of the electrode and the second electrode.

10. The magnetic memory device of claim 1, wherein the layer stack further comprises a SAF structure contacting the reference layer.

11. The magnetic memory device of claim 1, wherein the tunnel barrier layer comprises a dielectric layer having a thickness of 1 nm to 2 nm.

12. The magnetic memory device of claim 1, further comprising a sensing circuit configured to determine tunneling magnetoresistance of the layer stack between the first electrode and the second electrode.

13. The magnetic memory device of claim 12, further comprising programming circuit connected to the first electrode and the second electrode and configured to non-deterministically program the magnetic memory device using non-deterministic VCMA programming.

14. The magnetic memory device of claim 13, wherein the programming circuit is configured to:
to determine whether a memory state of the magnetic memory device is in a target state or not by comparing a measured value of the tunneling magnetoresistance of the layer stack to a target value; and
to apply a programming voltage pulse that induces precession of an angle between a magnetization direction of the free layer and an axial direction that is perpendicular to the interface between the free layer and the tunnel barrier layer if the magnetic memory device is not in the target state, and not to apply any programming voltage pulse if the magnetic memory device is in the target state.

15. The magnetic memory device of claim 14, wherein the in-plane magnetization of the VCMA assist structure induces precession of the angle between the magnetization direction of the free layer and the axial direction between 0 degree and 180 degrees upon application of the programming voltage pulse without applying an external magnetic field.

16. A method of operating the magnetic memory device of claim 1, comprising determining tunneling magnetoresistance of the layer stack.

17. The method of claim 16, further comprising non-deterministically programming the magnetic memory device without applying an external magnetic field by applying a VCMA programming voltage pulse between the first electrode and the second electrode.

18. The method of claim 17, further comprising:
determining whether a memory state of the magnetic memory device is in a target state or not by comparing a measured value of the tunneling magnetoresistance of the layer stack to a target value; and
applying the VCMA programming voltage pulse that induces a precession of an angle between a magnetization direction of the free layer and an axial direction that is perpendicular to the interface between the free layer and the tunnel barrier layer if the magnetic memory device is not in the target state, and not applying any programming voltage pulse if the magnetic memory device is in the target state.

19. The method of claim 18, wherein a duration of the programming voltage pulse is selected such that the angle between the magnetization direction and the axial direction changes by more than 135 degrees at an end of the programming voltage pulse.

* * * * *